United States Patent
Goto et al.

(10) Patent No.: US 9,680,602 B2
(45) Date of Patent: Jun. 13, 2017

(54) BIT CODING DEVICE, BIT DECODING DEVICE, TRANSMISSION DEVICE, RECEPTION DEVICE, BIT CODING METHOD, BIT DECODING METHOD, TRANSMISSION METHOD, RECEPTION METHOD, AND PROGRAM

(71) Applicants: Sharp Kabushiki Kaisha, Osaka-shi, Osaka (JP); OSAKA UNIVERSITY, Osaka (JP)

(72) Inventors: Jungo Goto, Osaka (JP); Hiroki Takahashi, Osaka (JP); Osamu Nakamura, Osaka (JP); Kazunari Yokomakura, Osaka (JP); Yasuhiro Hamaguchi, Osaka (JP); Shinsuke Ibi, Osaka (JP); Seiichi Sampei, Osaka (JP); Shinichi Miyamoto, Osaka (JP)

(73) Assignees: SHARP KABUSHIKI KAISHA, Osaka (JP); OSAKA UNIVERSITY, Osaka (JP)

( * ) Notice: Subject to any disclaimer, the term of this patent is extended or adjusted under 35 U.S.C. 154(b) by 0 days.

(21) Appl. No.: 14/420,873

(22) PCT Filed: Aug. 13, 2013

(86) PCT No.: PCT/JP2013/071889
§ 371 (c)(1),
(2) Date: Feb. 10, 2015

(87) PCT Pub. No.: WO2014/027664
PCT Pub. Date: Feb. 20, 2014

(65) Prior Publication Data
US 2015/0244496 A1    Aug. 27, 2015

(30) Foreign Application Priority Data
Aug. 14, 2012    (JP) .................................. 2012-179870

(51) Int. Cl.
H04L 1/00    (2006.01)
H03M 13/29    (2006.01)
G06F 11/10    (2006.01)

(52) U.S. Cl.
CPC ............ *H04L 1/0041* (2013.01); *G06F 11/10* (2013.01); *H03M 13/2957* (2013.01)

(58) Field of Classification Search
CPC . G06F 11/10; G11B 20/1833; G11B 20/1426; H04L 1/005; H04L 1/0071;
(Continued)

(56) References Cited

U.S. PATENT DOCUMENTS 7,680,187 B2 *   3/2010   Kitamura ................. H04N 7/50
                                                           375/240.16
9,214,962 B2 *  12/2015   Murakami ......... H03M 13/1154
(Continued)

FOREIGN PATENT DOCUMENTS

JP    6-311053 A    11/1994
JP   2012-34137 A    2/2012

OTHER PUBLICATIONS

"3GPP TS 36.212 (V10.4.0) "Evolved Universal Terrestrial Radio Access (E-UTRA) Multiplexing and channel coding, 2012.
(Continued)

*Primary Examiner* — April Y Blair
*Assistant Examiner* — Rong Tang
(74) *Attorney, Agent, or Firm* — Birch, Stewart, Kolasch & Birch, LLP

(57) ABSTRACT

A bit coding device that creates a coded bit sequence by performing error correction coding on an input bit sequence that is input, includes a coding unit that creates a first bit sequence by performing the error correction coding on the input bit sequence, an extraction unit that extracts a second bit sequence from the first bit sequence, and an information
(Continued)

compression unit that creates a third bit sequence by performing lossy compression on the second bit sequence, in which coded bits include at least a portion of the third bit sequence.

12 Claims, 24 Drawing Sheets

(58) Field of Classification Search
CPC ... H04L 1/0041; H04L 1/0068; H04L 1/0075; H04L 1/0069; H03M 13/2957; H03M 13/6325; H03M 13/2948
See application file for complete search history.

(56) References Cited

U.S. PATENT DOCUMENTS

| | | | | |
|---|---|---|---|---|
| 2002/0023247 | A1* | 2/2002 | Akiyama | H04L 1/0041 714/758 |
| 2011/0158359 | A1* | 6/2011 | Khayrallah | H03M 13/2957 375/346 |
| 2011/0320920 | A1* | 12/2011 | Sampei | H03M 13/2957 714/786 |
| 2013/0297993 | A1* | 11/2013 | Murakami | H03M 13/036 714/786 |
| 2014/0108894 | A1* | 4/2014 | Hirano | G06F 11/10 714/776 |

OTHER PUBLICATIONS

Berrou et al., "Near Shannon Limit Error—Correcting Coding and Decoding : Turbo-Codes (1)", Proc. ICC'93, May 1993, pp. 1064-1070, Geneva, Switzerland.
International Search Report, issued in PCT/JP2013/071889, dated Aug. 1, 2013.
Kitamura et al., "A Hybrid Structured Turbo Code of CBRM in Conjunction with XOR Coded Parity Compression", Information Theory and its Applications (ISITA), 2012 International Symposium, Oct. 31, 2012, pp. 759-763, Honolulu, Hawaii.
Kitamura et al., "A Study on High Rate Turbo Code Exploiting XOR Coded Parity Compressions", Technical Report of IEICE, The Institute of Electronics, Information and Communication Engineers, Aug. 2012, pp. 37-41.

* cited by examiner

US 9,680,602 B2

BIT CODING DEVICE, BIT DECODING DEVICE, TRANSMISSION DEVICE, RECEPTION DEVICE, BIT CODING METHOD, BIT DECODING METHOD, TRANSMISSION METHOD, RECEPTION METHOD, AND PROGRAM

TECHNICAL FIELD

The present invention relates to a bit coding device, a bit decoding device, a transmission device, a reception device, a bit coding method, a bit decoding method, a transmission method, a reception method, and a program.

The present application claims the benefit of priority of Japanese Patent Application No. 2012-179870 filed on Aug. 14, 2012, the contents of which are herein incorporated by reference.

BACKGROUND ART

In wireless communications, error correction codes are used in order to correct errors that are caused by thermal noise in a receiver. Since the technology of error correction codes may reduce a transmission energy required for 1 bit, it has been studied actively in the field of code theory. Currently, as error correction codes that are used generally, there are convolutional codes such as a Non-Systematic Convolutional (NSC) code and a Recursive Systematic Convolutional (RSC) code, a turbo code that uses the RSC code a plurality of times (refer to NPL 1), a Low Density Parity Check (LDPC) code and the like. In particular, the turbo code is known as a strong error correction code that is capable of achieving characteristics that are close to a Shannon limit that indicates an upper limit of a transmissible bit number, which is given mathematically, through repeated decoding based on a turbo theory.

Therefore, the turbo code is adopted as an error correction code of data signals in standards such as Long Term Evolution (LTE) and LTE-Advanced of The Third Generation Partnership Project (3GPP), a standards organization (refer to NPL 2). In the turbo code that is used in 3GPP, a configuration that outputs error correction coding bits with a coding rate of one third is adopted through parallel continuous coding of an RSC code with a constraint length of 4 via an interleaver.

In addition, link adaptation, which controls a Modulation and Coding Scheme (MCS) that is used in data transmission in an adaptive manner, is adopted in the LTE and the LTE-Advanced in order to secure a certain error rate with respect to differences in reception levels and fluctuations in reception quality. This link adaptation realizes a coding rate that is higher than a coding rate of one third through a puncturing process that punctures a portion of parity bits. By transmitting an error correction coding bit sequence with a higher coding rate through puncturing, an improvement in transmission rate becomes possible.

CITATION LIST

Non-Patent Document

NPL 1: C. Berrou, A. Glavieux and P. Thitimajshima, "Near Shannon limit error-correcting coding and decoding: turbo-codes," in Proc. ICC'93, Geneva, Switzerland, May 1993, pp. 1064-1070

NPL 2: 3GPP TS 36.212 (V10.4.0) "Evolved Universal Terrestrial Radio Access (E-UTRA) Multiplexing and channel coding"

DISCLOSURE OF THE INVENTION

Problems to be Solved by the Invention

However, as mentioned above, in a system that realizes a higher coding rate through puncturing, information of parity bits that are punctured by puncturing is not transmitted. Therefore, information of parity bits that are punctured is not used in a decoding process on a reception side. As a result of this, if the coding rate is increased, there is a problem in that an error correction capability of the error correction code deteriorates greatly, and therefore, a difference between a transmissible bit number, which is established by a Shannon limit, and a transmissible bit number that may be achieved by the error correction code, becomes larger.

The present invention is made in the light of this kind of situation, and an object thereof is to provide a bit coding device, a bit decoding device, a transmission device, a reception device, a bit coding method, a bit decoding method, a transmission method, a reception method and a program that may suppress a deterioration in the error correction capability when a coding rate rises.

Means for Solving the Problems (1) The present invention is made in order to solve the problem mentioned above, and an aspect of the present invention includes a bit coding device that creates a coded bit sequence by performing error correction coding on an input bit sequence that is input, the bit coding device including a coding unit that creates a first bit sequence by performing the error correction coding on the input bit sequence, an extraction unit that extracts a second bit sequence from the first bit sequence, and an information compression unit that creates a third bit sequence by performing lossy compression on the second bit sequence, in which the coded bits include at least a portion of the third bit sequence.

(2) In addition, another aspect of the present invention includes the bit coding device according to (1), in which the information compression unit creates the third bit sequence using an exclusive-OR operation of bits that configure the second bit sequence.

(3) In addition, still another aspect of the present invention includes the bit coding device according to (2), in which the exclusive-OR operation is an exclusive-OR operation with three or more bits.

(4) In addition, still another aspect of the present invention includes the bit coding device according to any one of (1) to (3), further including a duplication unit that duplicates bits among the third bit sequence that are included in the coded bit sequence, and a modulation bit configuration unit that determines an alignment order of the coded bit sequence so that at least a portion of modulation symbols become modulation symbols that correspond to a bit group that includes bits of a duplication source of duplication by the duplication unit and duplicated bits when modulation symbols are created using the coded bit sequence.

(5) In addition, still another aspect of the present invention includes a bit decoding device that decodes a signal based on a coded bit sequence that is coded by the bit coding device according to (1), the bit decoding device including a discrimination unit that extracts a signal that corresponds to the third bit sequence from an input signal, a decoding unit that performs a decoding process on the input signal, and an external information extraction unit that creates a signal that corresponds to at least a portion of the second bit sequence using a signal that the discrimination unit extracts and decoding process results of the decoding unit, in which the decoding unit performs the decoding process on the input signal using the signal that the external information extraction unit creates, at least once.

(6) In addition, still another aspect of the present invention includes the bit decoding device according to (4), in which the external information extraction unit creates the signal that corresponds to at least the portion of the second bit sequence by calculating an exclusive-OR operation of the signal that the discrimination unit extracts and a portion of portions of the decoding process results that correspond to the second bit sequence.

(7) In addition, still another aspect of the present invention includes a bit decoding device that decodes a signal based on a coded bit sequence that is coded by the bit coding device according to (4), the bit decoding device including a synthesis unit that synthesizes a signal that, among input signals, corresponds to bits of a duplication source and a signal that corresponds to duplicated bits, a decoding unit that performs a decoding process on the input signal, and an external information extraction unit that creates a signal that corresponds to at least a portion of the second bit sequence using a signal that the synthesis unit synthesizes and decoding process results of the decoding unit, in which the decoding unit performs the decoding process on the input signal using the signal that the external information extraction unit creates, at least once.

(8) In addition, still another aspect of the present invention includes a transmission device including the bit coding device according to (1), a modulation unit that creates a modulation symbol sequence that corresponds to a coded bit sequence that the bit coding device creates, and a transmission unit that transmits a signal based on the modulation symbol sequence.

(9) In addition, still another aspect of the present invention includes the transmission device according to (8), further including a compression control unit that determines a ratio of a bit number of the third bit sequence that the bit coding device includes in the coded bit sequence, with respect to a bit number of the input bit sequence, depending on a coding rate in the bit coding device or a modulation method in the modulation unit.

(10) In addition, still another aspect of the present invention includes the transmission device according to (8), further including a compression control unit that determines a ratio of a bit number of the third bit sequence that the bit coding device includes in the coded bit sequence, with respect to a bit number of the input bit sequence, depending on a number of times of retransmission of the input bit sequence.

(11) In addition, still another aspect of the present invention includes the transmission device according to (8), further including a compression control unit that determines a ratio of a bit number of the third bit sequence that the bit coding device includes in the coded bit sequence, with respect to a bit number of the input bit sequence, using EXtrinsic Information Transfer (EXIT) analysis.

(12) In addition, still another aspect of the present invention includes a reception device including the bit decoding device according to (5), a reception unit that receives a signal, and a demodulation unit that demodulates the received signal, and inputs demodulation results to the bit decoding device as the input signal.

(13) In addition, still another aspect of the present invention includes the reception device according to (12), further including a compression control unit that decides a ratio of a signal that corresponds to the third bit sequence in the demodulation results depending on a coding rate in the bit coding device or a modulation method in the demodulation unit, and reports to the discrimination unit of the bit decoding device, in which the discrimination unit performs extraction of the signal that corresponds to the third bit sequence using the ratio.

(14) In addition, still another aspect of the present invention includes the reception device according to (12), further including a compression control unit that decides a ratio of the signal that corresponds to the third bit sequence in the demodulation results depending on a number of times of retransmission of the received signal, and reports to the discrimination unit of the bit decoding device, in which the discrimination unit performs extraction of the signal that corresponds to the third bit sequence using the ratio.

(15) In addition, still another aspect of the present invention includes the reception device according to (12), further including a compression control unit that decides a ratio of the signal that corresponds to the third bit sequence in the demodulation results using EXIT analysis, and reports to the discrimination unit of the bit decoding device, in which the discrimination unit performs extraction of the signal that corresponds to the third bit sequence using the ratio.

(16) In addition, still another aspect of the present invention includes a bit coding method of creating a coded bit sequence by performing error correction coding on an input bit sequence that is input, the bit coding method including a coding step of creating a first bit sequence by performing the error correction coding on the input bit sequence, an extraction step of extracting a second bit sequence from the first bit sequence, and an information compression step of creating a third bit sequence by performing lossy compression on the second bit sequence, in which the coded bits include at least a portion of the third bit sequence.

(17) In addition, still another aspect of the present invention includes a bit decoding method of decoding a signal based on a coded bit sequence that is coded by the bit coding method according to (16), the bit decoding method including a discrimination step of extracting a signal that corresponds to the third bit sequence from an input signal, a decoding step of performing a decoding process on the input signal, and an external information extraction step of creating a signal that corresponds to at least a portion of the second bit sequence using a signal that is extracted in the discrimination step and decoding process results of the decoding step, in which, in the decoding step, the decoding process is performed on the input signal using the signal that is created in the external information extraction step, at least once.

(18) In addition, still another aspect of the present invention includes a transmission method including a bit coding step of creating a coded bit sequence by performing error correction coding on an input bit sequence that is input, a modulation step of creating a modulation symbol sequence that corresponds to a coded bit sequence that is created in the bit coding step, and a transmission step of transmitting a signal based on the modulation symbol sequence, in which the bit coding step includes a coding step of creating a first bit sequence by performing the error correction coding on the input bit sequence, an extraction step of extracting a second bit sequence from the first bit sequence, and an information compression step of creating a third bit sequence by performing lossy compression on the second bit sequence, and in which the coded bits include at least a portion of the third bit sequence.

(19) In addition, still another aspect of the present invention includes a reception method of receiving a signal based on a coded bit sequence that is coded by the bit coding method according to (16), the reception method including a reception step of receiving a signal, a demodulation step of demodulating the received signal, and a bit decoding step of decoding demodulation results, in which the bit decoding step includes a discrimination step of extracting a signal that corresponds to the third bit sequence from the demodulation results of the demodulation step, a decoding step of performing a decoding process on the demodulation results, and an external information extraction step of creating a signal that corresponds to at least a portion of the second bit sequence using a signal that is extracted in the discrimination step and decoding process results of the decoding unit, and, in the decoding step, the decoding process is performed on the demodulation results using the signal that is created in the external information extraction, at least once.

(20) In addition, still another aspect of the present invention includes a program that causes a computer of a bit coding device that creates a coded bit sequence by performing error correction coding on an input bit sequence that is input to function as a coding unit that creates a first bit sequence by performing the error correction coding on the input bit sequence, an extraction unit that extracts a second bit sequence from the first bit sequence, and an information compression unit that creates a third bit sequence by performing lossy compression on the second bit sequence, in which the coded bits include at least a portion of the third bit sequence.

(21) In addition, still another aspect of the present invention includes a program that causes a computer of a bit decoding device that decodes a signal based on a coded bit sequence that is coded by the bit coding device according to claim 1, to function as a discrimination unit that extracts a signal that corresponds to the third bit sequence from an input signal, a decoding unit that performs a decoding process on the input signal, and an external information extraction unit that creates a signal that corresponds to at least a portion of the second bit sequence using a signal that the discrimination extracts and decoding process results of the decoding unit, in which the decoding unit performs the decoding process on the input signal using the signal that the external information extraction creates, at least once.

(22) In addition, still another aspect of the present invention includes a program for causing a computer to function as the bit coding device according to (1), a modulation unit that creates a modulation symbol sequence that corresponds to a coded bit sequence that the bit coding device creates, and a transmission unit that transmits a signal based on the modulation symbol sequence.

(23) In addition, still another aspect of the present invention includes a program for causing a computer to function as the bit decoding device according to claim 5, a reception unit that receives a signal, and a demodulation unit that demodulates the received signal, and inputs demodulation results to the bit decoding device as the input signal.

Effects of the Invention

According to the invention, it is possible to suppress a deterioration in the error correction capability when a coding rate rises.

MODE FOR CARRYING OUT THE INVENTION

Hereinafter, embodiments of the present invention will be described with reference to the drawings. Each of the following embodiments may be applied to either downlink (transmission from a base station device to a mobile station device) or uplink (transmission from a mobile station device to a base station device) in a cellular system. That is, the base station device may be provided with a transmission device and the mobile station device may be provided with a reception device, or the mobile station device may be provided with a transmission device and the base station device may be provided with a reception device.

In addition, description of a case in which a transmission method of data is set as Orthogonal Frequency Division Multiplexing (OFDM), which is multi-carrier system, is given, but any transmission method other than this such as Discrete Fourier Transform-Spread-OFDM (DFT-S-OFDM) or Clustered DFT-S-OFDM may be used. In addition, a description in which a number of antennae that a transmission device and a reception device have is respectively set as one will be given, but a transmission device and a reception device may have a plurality of antennas, and may be configured so as to use a transmission and reception diversity technique or a Multiple Input Multiple Output (MIMO) transmission method.

First Embodiment

Figure 1:
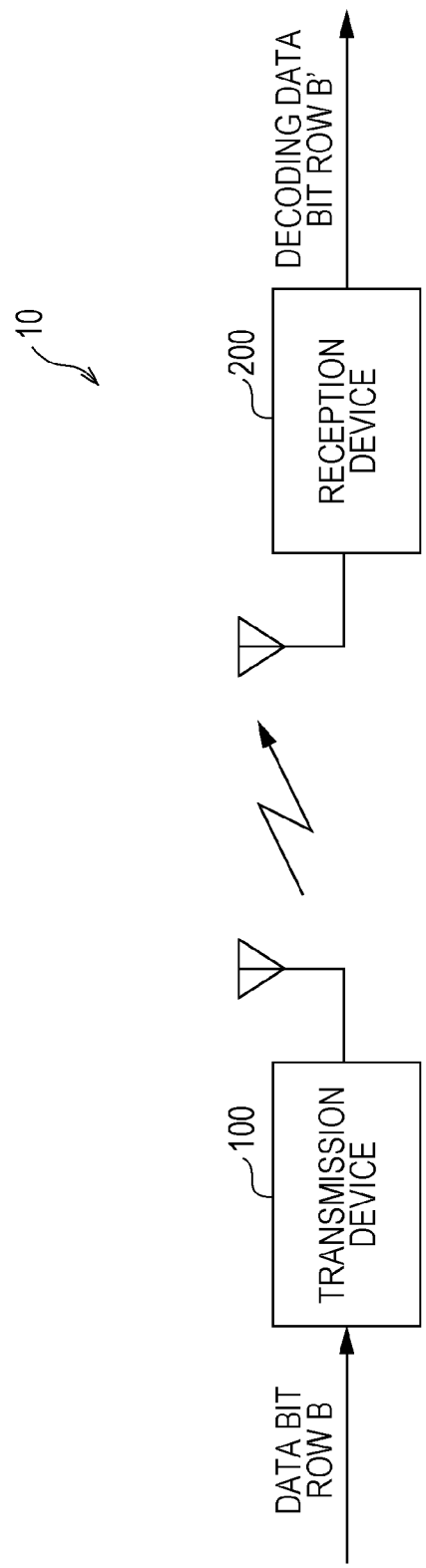
FIG. 1 is a schematic block diagram that illustrates a configuration of a wireless communication system 10 according to a first embodiment of the invention.

FIG. 1 is a schematic block diagram that illustrates a configuration of a wireless communication system 10 according to the present embodiment. As illustrated in FIG. 1, the wireless communication system 10 is configured to include a transmission device 100 and a reception device 200. The transmission device 100 creates a signal that represents an input data bit sequence B, and transmits the signal to the reception device 200 in a wireless manner. The reception device 200 receives a signal that the transmission device 100 transmits, and creates a decoded data bit sequence B' by decoding a data bit sequence that a received signal represents.

Additionally, the data bit sequence B is a bit sequence that is configured from a plurality of data bits, but may be a bit sequence of so-called user data, or may be a bit sequence of control information for controlling communication between the transmission device 100 and the reception device 200.

Figure 2:
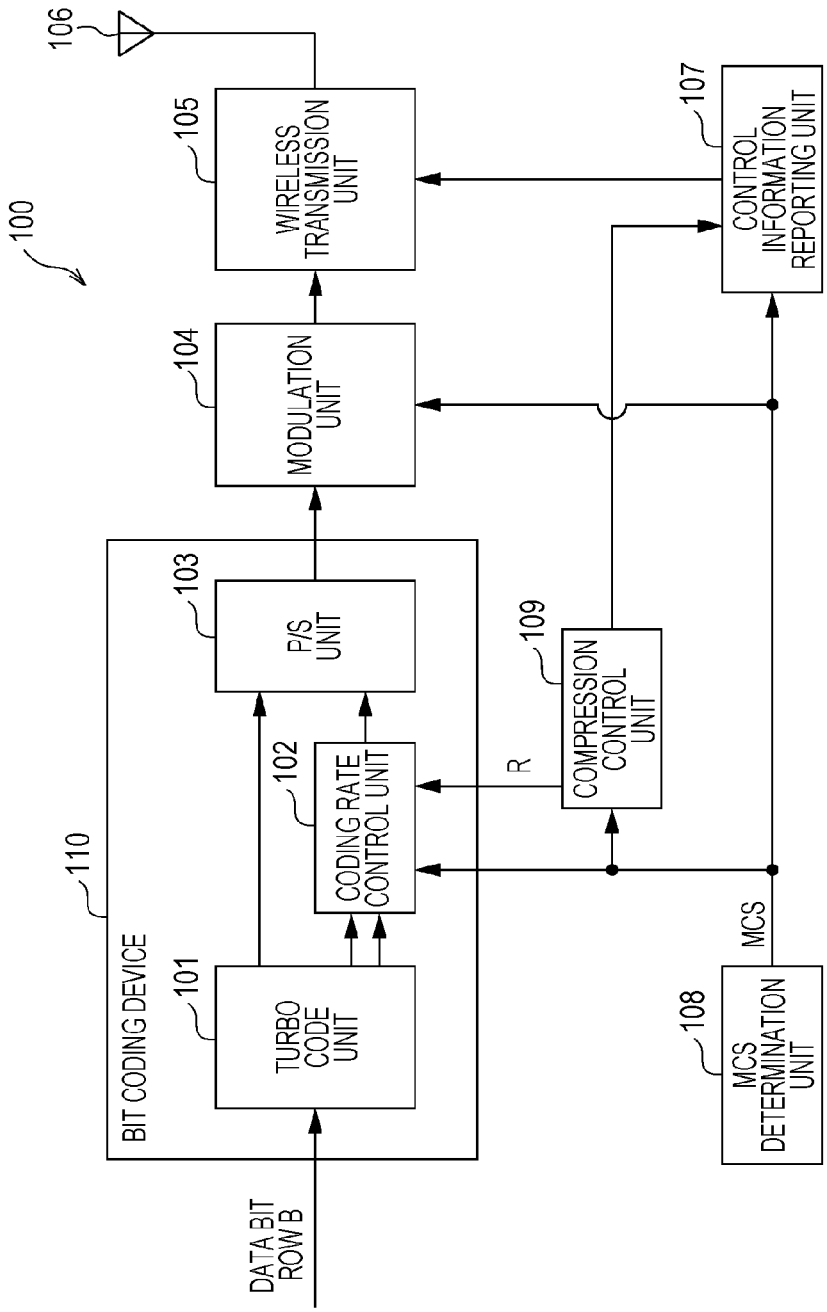
FIG. 2 is a schematic block diagram that illustrates a configuration example of a transmission device 100 in the same embodiment.

FIG. 2 is a schematic block diagram that illustrates a configuration example of the transmission device 100. As illustrated in FIG. 2, the transmission device 100 is configured to include a bit coding device 110, a modulation unit 104, a wireless transmission unit 105, an antenna 106, a control information reporting unit 107, an MCS determination unit 108, and a compression control unit 109. The bit coding device 110 creates a coded bit sequence by applying an error correction code to an input data bit sequence B. As illustrated in FIG. 2, the bit coding device 110 is configured to include a turbo code unit 101, a coding rate control unit 102, and a P/S unit 103. The turbo code unit 101 (the coding unit) creates a systematic bit sequence S, a first parity bit sequence P1, and a second parity bit sequence P2 by carrying out turbo coding on the input data bit sequence B. A bit sequence in which the systematic bit sequence S, the first parity bit sequence P1, and the second parity bit sequence P2 are combined corresponds to a first bit sequence.

The coding rate control unit 102 creates a third parity bit sequence P3 by carrying out puncturing and a lossy compression process on the first parity bit sequence P1 and the second parity bit sequence P2. Additionally, the coding rate control unit 102 performs puncturing that depends on a combined MCS of a coding rate and a modulation method, which is designated by the MCS determination unit 108, and carries out a lossy compression process on bits that depends on a ratio R, which is designated by the compression control unit 109. In this instance, the ratio R is a ratio of bits which are to be a target of the lossy compression process, to bits that are remaining as a result of puncturing having been performed with the first parity bit sequence P1 and the second parity bit sequence P2. The P/S unit 103 performs parallel/serial conversion of the systematic bit sequence S that the turbo code unit 101 creates, and the third parity bit sequence P3 that the coding rate control unit 102 creates. As a result of this parallel/serial conversion, the P/S unit 103 creates a coded bit sequence by realigning the systematic bit sequence S and the third parity bit sequence P3 in an order that is determined in advance.

The modulation unit 104 creates modulation symbols by carrying out modulation such as Quaternary Phase Shift Keying (QPSK), 16-ary Quadrature Amplitude Modulation (16-QAM), or 64-QAM on input coded bit sequences. The modulation method that is used depends on a combined MCS of a coding rate and a modulation method, which is designated by the MCS determination unit 108. The wireless transmission unit 105 creates a time domain signal using Inverse Fast Fourier Transform (IFFT) after performing frequency mapping of modulation symbols that the modulation unit 104 creates and a control signal that the control information reporting unit 107 creates. The wireless transmission unit 105 further performs the insertion of a Cyclic Prefix (CP), Digital/Analog (D/A) conversion, and upconversion to a wireless frequency. The wireless transmission unit 105 creates a transmission signal by amplifying an upconverted signal to a predetermined transmission power using a Power Amplifier (PA). The antenna 106 transmits a transmission signal that the wireless transmission unit 105 creates.

The control information reporting unit 107 creates a control signal that indicates a combined MCS of a coding rate and a modulation method that the MCS determination unit 108 determines and a ratio R that the compression control unit 109 determines, and inputs the control signal to the wireless transmission unit 105. The MCS determination unit 108 determines a combined MCS of a coding rate and a modulation method. Any method such as a publicly-known method that performs determination depending on propagation route characteristics between the transmission device 100 and the reception device 200 may be used as the determination method. For example, a method that performs determination by setting an MCS that satisfies an error rate of 0.1 from propagation route characteristics that are measured using a reference signal or the like, or the like may be set.

The compression control unit 109, for example, determines a ratio R depending on a combined MCS of a coding rate and a modulation method that the MCS determination unit 108 determines. As determination methods of the ratio R, there are a method that performs determination using EXtrinsic Information Transfer (EXIT) analysis, a method that performs determination using a coding rate, a method that performs determination depending on a modulation method that is used in transmission, a method that performs determination depending on propagation route characteristics, and a method that performs determination depending on whether or not MIMO transmission is used.

In methods that perform determination depending on a coding rate or a modulation method, for example, the ratio R increases with increases in either or both the coding rate and a modulation multi-value. In addition, as another example, the ratio R increases in a case in which a number of streams increases or propagation route characteristics are poor. By performing determination of the ratio R of parity bits that perform information compression using these pieces of information in this manner, it is possible to set an optimum value, and therefore, it is possible to improve error rate characteristics.

Figure 3:
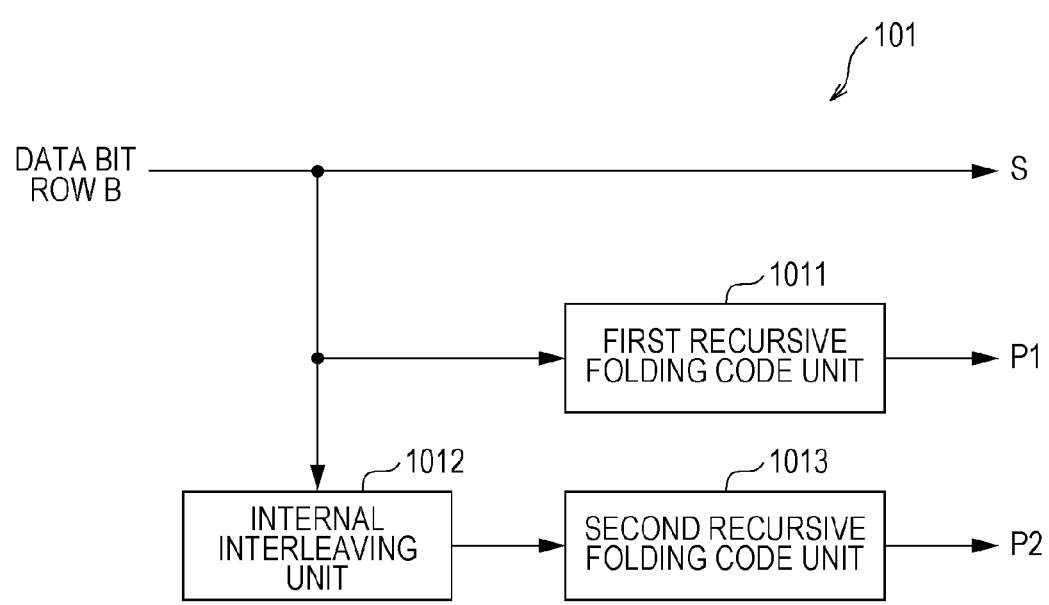
FIG. 3 is a schematic block diagram that illustrates a configuration example of a turbo code unit 101 in the same embodiment.

FIG. 3 is a schematic block diagram that illustrates a configuration example of the turbo code unit 101. The turbo code unit 101 performs turbo coding with a coding rate of a third. As illustrated in FIG. 3, the turbo code unit 101 is configured to include a first recursive convolutional code unit 1011, an internal interleaving unit 1012, and a second recursive convolutional code unit 1013. A data bit sequence B that is input to the turbo code unit 101 is output as a systematic bit S without change. The first recursive convolutional code unit 1011 creates the first parity bit sequence P1 by applying recursive convolutional code to the data bit sequence B. The internal interleaving unit 1012 performs conversion of a bit order that is determined in advance on the data bit sequence B, and performs bit interleaving. The second recursive convolutional code unit 1013 creates the second parity bit sequence P2 by applying recursive convolutional code to a bit sequence on which bit interleaving has been performed by the internal interleaving unit 1012.

Figure 4:
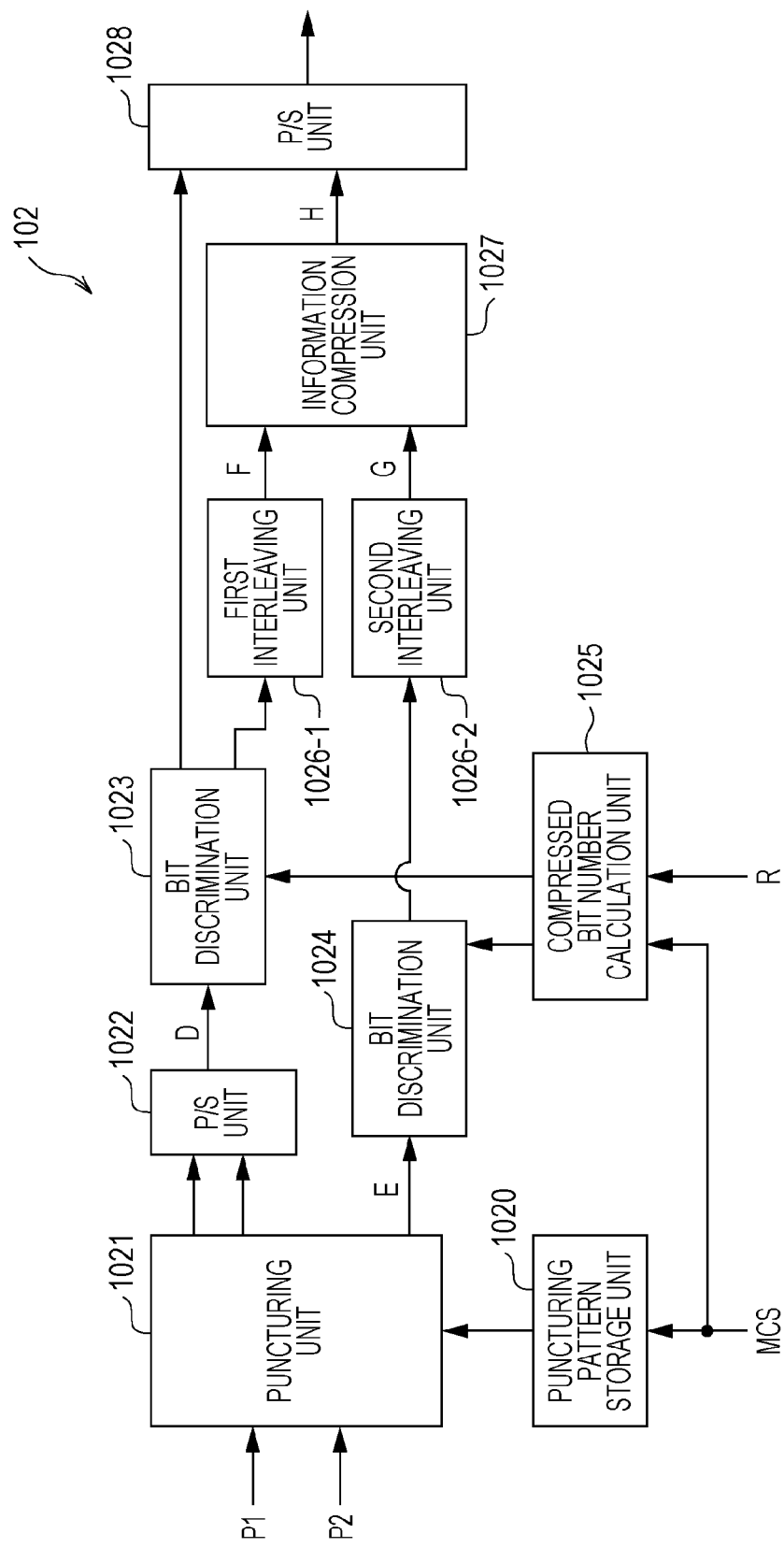
FIG. 4 is a schematic block diagram that illustrates a configuration example of a coding rate control unit 102 in the same embodiment.

FIG. 4 is a schematic block diagram that illustrates a configuration example of the coding rate control unit 102. As illustrated in FIG. 4, the coding rate control unit 102 is configured to include a puncturing pattern storage unit 1020, a puncturing unit 1021, a P/S unit 1022, bit discrimination units 1023 and 1024, a compressed bit number calculation unit 1025, a first interleaving unit 1026-1, a second interleaving unit 1026-2, an information compression unit 1027 and a P/S unit 1028.

The puncturing pattern storage unit 1020 stores puncturing patterns, which are patterns for each coding rate that puncture parity bits. When a combined MCS of a coding rate and a modulation method is designated from the MCS determination unit 108, the puncturing pattern storage unit 1020 reads a puncturing pattern of a corresponding coding rate, and inputs the puncturing pattern to the puncturing unit 1021.

The puncturing unit 1021 performs puncturing on the first parity bit sequence P1 and the second parity bit sequence P2 according to the puncturing pattern that is input from the puncturing pattern storage unit 1020. In this instance, puncturing is the puncturing of a portion of the bits, and a puncturing pattern is a pattern that indicates bit positions of bits that are to be punctured. The puncturing unit 1021 inputs bit sequences E that are formed from punctured bits to the bit discrimination unit 1024. In addition, the puncturing unit 1021 inputs two bit sequences of a bit sequence PP1 that is formed from bits among the first parity bit sequence P1 that were not punctured, and a bit sequence PP2 that is formed from bits among the second parity bit sequence P2 that were not punctured, to the P/S unit 1022.

The P/S unit 1022 performs parallel/serial conversion of the two bit sequences that the puncturing unit 1021 input, forms a single parity bit sequence D from the result, and inputs the parity bit sequence D to the bit discrimination unit 1023.

The bit discrimination unit 1023 (the extraction unit) sets bits of a compressed bit number that is input from the compressed bit number calculation unit 1025 as compression target bits (the second bits) and separates the compression target bits from the parity bit sequence D that is input from the P/S unit 1022. The bit discrimination unit 1023 inputs the separated compression target bits to the first interleaving unit 1026-1, and inputs the remaining non-compression target bits to the P/S unit 1028.

A bit selection method with which the bit discrimination unit 1023 outputs to the P/S unit 1028 or the first interleaving unit 1026-1 may select so that there is an equal number of bits of the first parity bit sequence P1 and bits of the second parity bit sequence P2 in the compression target bits, may set bits that are extracted from the parity bit sequence D at regular intervals as the compression target, or may be another selection method. However, the selection method is already known by the reception device 200, or alternatively, the selection method is reported to the reception device 200.

The bit discrimination unit 1024 (the extraction unit) sets bits of a compressed bit number that is input from the compressed bit number calculation unit 1025 as compression target bits (the second bits) and separates the compression target bits from the bit sequences E that are input from the puncturing unit 1021. The bit discrimination unit 1024 inputs the separated compression target bits to the second interleaving unit 1026-2, and discards non-compression target bits that were not separated. Additionally, a bit selection method that performs separation may be any method, and the selection method is already known by the reception device 200, or alternatively, the selection method is reported to the reception device 200.

The compressed bit number calculation unit 1025 calculates a compressed bit number for information compression using a ratio R that the compression control unit 109 determines, a data bit number N, and a coding rate $r_c$ indicated by a combined MCS that the MCS determination unit 108 determines. More specifically, the compressed bit number calculation unit 1025 calculates a compressed bit number using $R \times N \times (1-r_c)/r_c$, and inputs the calculated compressed bit number to the bit discrimination units 1023 and 1024. In this instance, the compressed bit number is a parity bit sequence after puncturing, and is a number of parity bits of the parity bit sequence D of bit number $N \times (1-r_c)/r_c$ that is set as a compression target. Additionally, the compressed bit number calculation unit 1025 may be configured to store compression pattern information that indicates positions of bits that are set as compression targets by the bit discrimination unit 1023 and the bit discrimination unit 1024 in association with a ratio R and a coding rate, and report to the bit discrimination unit 1023 and the bit discrimination unit 1024 by reading the compression pattern information.

The first interleaving unit 1026-1 creates an interleaved bit sequence F by realigning a compression target bit sequence that is input from the bit discrimination unit 1023 using a realignment pattern, which is already known by the reception device 200, and inputs the interleaved bit sequence F to the information compression unit 1027. The second interleaving unit 1026-2 creates an interleaved bit sequence G by realigning a compression target bit sequence that is input from the bit discrimination unit 1024 using a realignment pattern, which is different to that of the first interleaving unit 1026-1, and inputs the interleaved bit sequence G to the information compression unit 1027. In this instance, the realignment pattern of the second interleaving unit 1026-2 is already known by the reception device 200. Additionally, it is preferable that the first interleaving unit 1026-1 and the second interleaving unit 1026-2 are provided, but either one thereof may not be provided.

The information compression unit 1027 creates a XOR coded bit sequence H (the third bit sequence) by carrying out a lossy compression process on the interleaved bit sequence F and the interleaved bit sequence G that are input. In the present embodiment, an exclusive-OR operation of the interleaved bit sequence F and the interleaved bit sequence G is used as the lossy compression process. That is, the information compression unit 1027 obtains $H_i$, which is an $i^{th}$ bit of the XOR coded bit sequence H, by performing computation of an exclusive-OR operation of $F_i$, which is an $i^{th}$ bit of the bit sequence F, and G, which is an $i^{th}$ bit of the bit sequence G. The information compression unit 1027 inputs the XOR coded bit sequence H to the P/S unit 1028.

Additionally, in the present embodiment, an exclusive-OR operation is explained as an example of a lossy compression process, but when f (the bit sequence F, the bit sequence G)=bit sequence H, as long as f is a factor in which g and h, in which g (the bit sequence H, the bit sequence F) becomes bit sequence G, and h (the bit sequence H, the bit sequence G) becomes bit sequence F, are present, an exclusive-OR operation need not necessarily be used. However, a bit number of bit sequence H<a bit number of bit sequence F+a bit number of bit sequence G. In the present embodiment, f (the bit sequence F, the bit sequence G) is an exclusive-OR operation of the bit sequence F and the bit sequence G. Further, g (the bit sequence H, the bit sequence F) is an exclusive-OR operation of the bit sequence H and the bit sequence F, and h (the bit sequence H, the bit sequence G) is an exclusive-OR operation of the bit sequence H and the bit sequence G. Logical addition or logical multiplication may be used as other examples of application.

The P/S unit 1028 forms a single bit sequence by performing parallel/serial conversion of a non-compression target bit sequence that is input by the bit discrimination unit 1023 and the XOR coded bit sequence H that is input by the information compression unit 1027.

Figure 5:
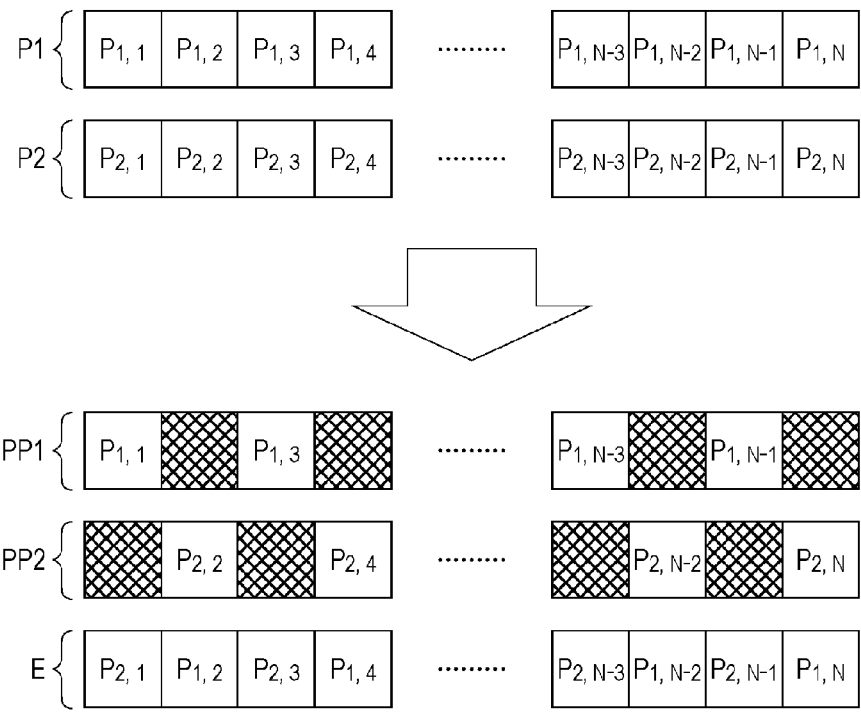
FIG. 5 is a diagram that illustrates an action of a puncturing unit 1021 in the same embodiment.

FIG. 5 is a diagram that describes an action of the puncturing unit 1021. FIG. 5 is an example in which a coding rate is half. In FIG. 5, bits $P_{1,1}$, $P_{1,2}$, $P_{1,3}$, $P_{1,4}$, ... $P_{1,N-2}$, $P_{1,N-1}$, and $P_{1,N}$ are a first parity bit sequence P1 that is input to the puncturing unit 1021 with a bit number N. In addition, bits $P_{2,1}$, $P_{2,2}$, $P_{2,3}$, $P_{2,4}$, ... $P_{2,N-2}$, $P_{2,N-1}$, and $P_{2,N}$ are a second parity bit sequence P2 that is input to the puncturing unit 1021 with a bit number N.

In order set the coding rate to half, in the example of FIG. 5, the puncturing unit 1021 punctures even-numbered bits of the first parity bit sequence P1, and punctures odd-numbered bits of the second parity bit sequence P2. As a result of this, a bit sequence PP1 that is obtained by puncturing the even-numbered bits of the first parity bit sequence P1, and a bit sequence PP2 that is obtained by puncturing the odd-numbered bits of the second parity bit sequence P2, and a bit sequence E that is formed from the punctured bits, are obtained. Therefore, as illustrated in FIG. 5, the bit sequence PP1 is formed from the bits $P_{1,1}$, $P_{1,3}$, ... $P_{1,N-3}$, and $P_{1,N-1}$, and the bit sequence PP2 is formed from the bits $P_{2,2}$, $P_{2,4}$, ... $P_{2,N-2}$, and $P_{2,N}$. In addition, the bit sequence E is formed from the bits $P_{2,1}$, $P_{1,2}$, $P_{2,3}$, $P_{1,4}$, ... $P_{2,N-3}$, $P_{1,N-2}$, $P_{2,N-1}$ and $P_{1,N}$.

Figure 6:
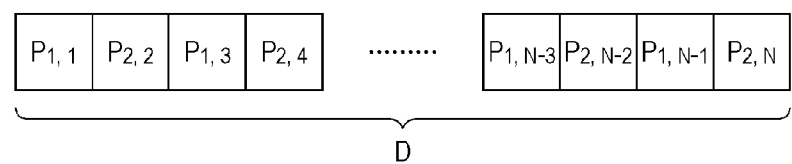
FIG. 6 is diagram that illustrates an example of a bit sequence D that a P/S unit 1022 creates in the same embodiment.

FIG. 6 is a diagram that illustrates an example of a bit sequence D that the P/S unit 1022 creates. In FIG. 6, an example of a case in which the P/S unit 1022 creates a single bit sequence D by alternately disposing bits that configure the input two bit sequences, is depicted. As illustrated in FIG. 6, when the two bit sequences that are input to the P/S unit 1022 are the bit sequence PP1 and the bit sequence PP2 of FIG. 5, the parity bit sequence D is formed from $P_{1,1}$, $P_{2,2}$, $P_{1,3}$, $P_{2,4}$, ... $P_{1,N-3}$, $P_{2,N-2}$, $P_{1,N-1}$, and $P_{2,N}$.

Figure 7:
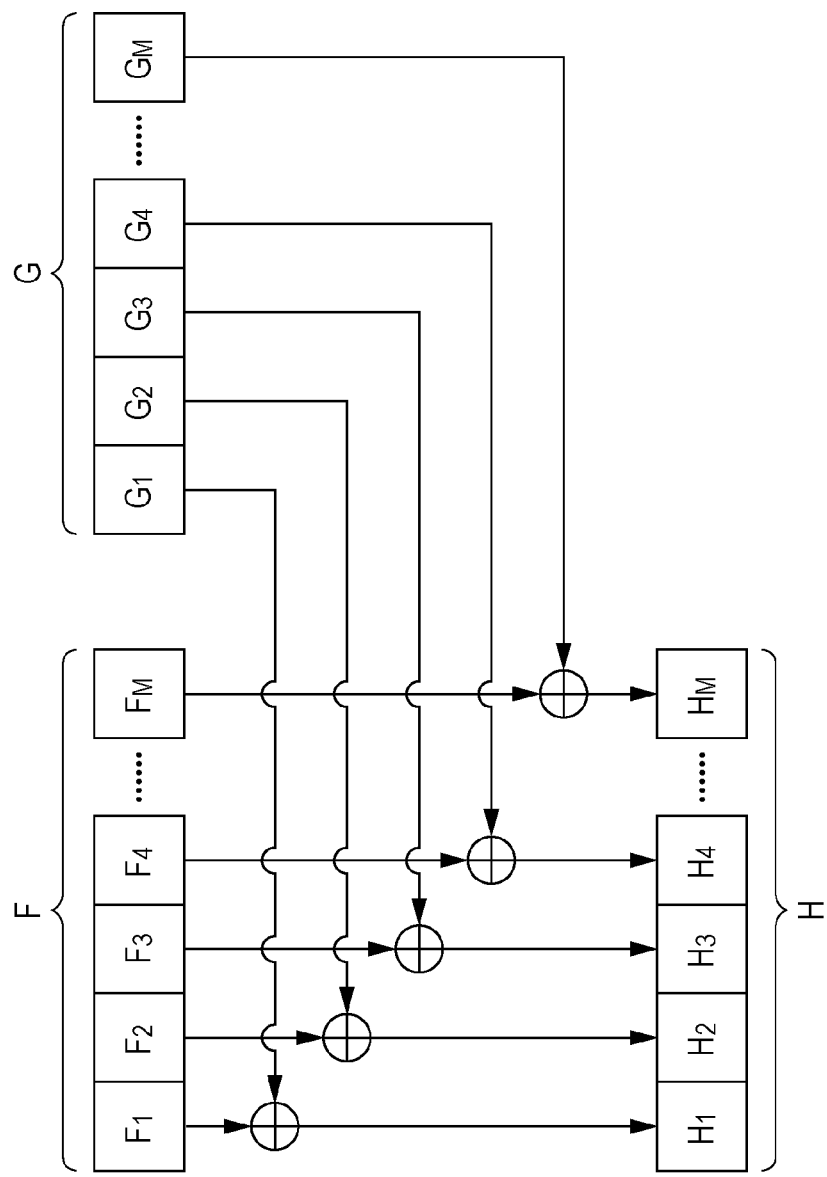
FIG. 7 is a diagram that illustrates an action of an information compression unit 1027 in the same embodiment.

FIG. 7 is a diagram that describes an action of the information compression unit 1027. As illustrated in FIG. 7, the information compression unit 1027 creates a bit sequence H with a bit number M by performing an exclusive-OR operation of a bit sequence F with a bit number M that the first interleaving unit 1026-1 creates, and a bit sequence G with a bit number M that the second interleaving unit 1026-2 creates. In FIG. 7, the bit sequence F is formed from bits $F_1$, $F_2$, $F_3$, $F_4$, ... and $F_M$, and the bit sequence G is formed from bits $G_1$, $G_2$, $G_3$, $G_4$, ... and $G_M$. At this time, a bit $H_1$ of the bit sequence H is an exclusive-OR operation of the bit $F_1$ and the bit $G_1$, and a bit $H_2$ is an exclusive-OR operation of the bit $F_2$ and the bit $G_2$. The same applies for bits $H_3$, $H_4$, ... and $H_M$.

Figure 8:
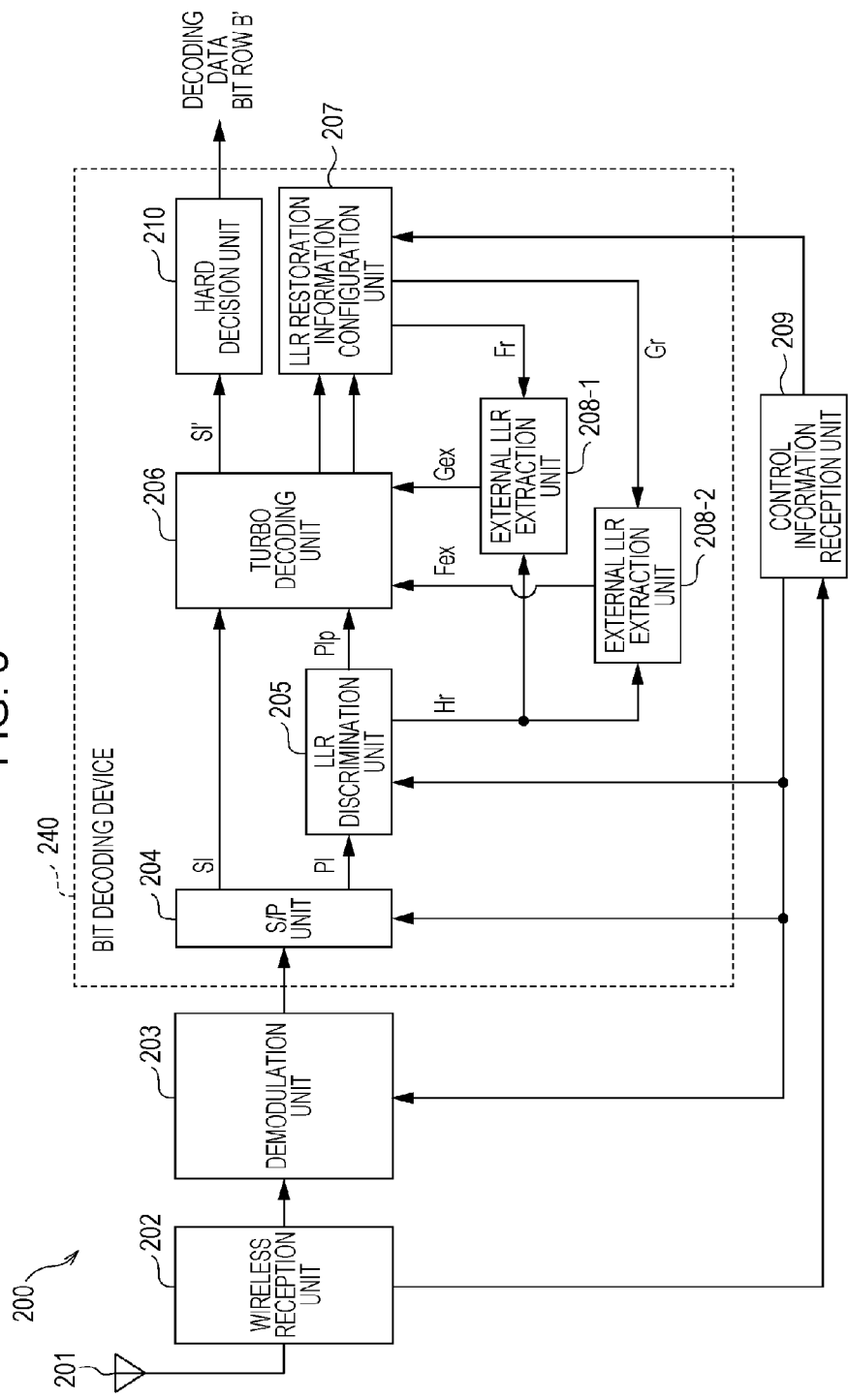
FIG. 8 is a schematic block diagram that illustrates a configuration example of a reception device 200 in the same embodiment.

FIG. 8 is a schematic block diagram that illustrates a configuration example of the reception device 200. In this instance, a configuration example of a case in which the reception device 200 only has a single reception antenna is depicted, but the reception device 200 may have two or more antennae. The reception device 200 is configured to include an antenna 201, a wireless reception unit 202, a demodulation unit 203, a bit decoding device 240, and a control information reception unit 209. The bit decoding device 240 is configured to include an S/P unit 204, an LLR discrimination unit 205, a turbo decoding unit 206, an LLR restoration information configuration unit 207, external LLR extraction units 208-1 and 208-2, and a hard decision unit 210.

The antenna 201 receives a signal that the transmission device 100 transmits. The wireless reception unit 202 performs downconversion of a signal that the antenna 201 receives to a baseband frequency, and converts the signal to a digital signal by performing Analogue/Digital (A/D) conversion thereof. The wireless reception unit 202 removes a Cyclic Prefix (CP) from the digital signal, and performs conversion to a frequency signal using Fast Fourier Transform (FFT). The wireless reception unit 202 performs processes that compensate for frequency demapping and propagation route fluctuations on the high frequency signal. Among signals that result from performing the abovementioned processes, the wireless reception unit 202 inputs a signal of control information to the control information reception unit 209, and inputs a signal of a data bit sequence to the demodulation unit 203.

The demodulation unit 203 calculates a Log Likelihood Ratio (LLR) of each bit by performing a demodulation process on a signal that is input from the wireless reception unit 202. At this time, the demodulation unit 203 performs a demodulation process that depends on a modulation method that is designated from the control information reception unit 209. The S/P unit 204 realigns LLRs that are input from the demodulation unit 203 to each LLR sequence by separating the LLRs into LLRs of systematic bits and LLRs of parity bits. The S/P unit 204 inputs an LLR sequence SI of systematic bits to the turbo decoding unit 206, and inputs an LLR sequence PI of parity bits to the LLR discrimination unit 205.

The control information reception unit 209 extracts a ratio R of parity bits that perform information compression, and a combined MCS of a coding rate and a modulation method from a signal of control information that is input from the wireless reception unit 202. The control information reception unit 209 inputs the extracted ratio R to the LLR discrimination unit 205 and the LLR restoration information configuration unit 207. In addition, the control information reception unit 209 inputs the extracted combined MCS of a coding rate and a modulation method to the demodulation unit 203, the S/P unit 204, the turbo decoding unit 206 and the LLR restoration information configuration unit 207.

The LLR discrimination unit 205 (the discrimination unit) separates the LLR sequence PI of parity bits that is input from the S/P unit 204 into a sequence PIp of LLRs that correspond to parity bits on which information compression was not carried out, and a sequence Hr of LLRs that correspond to parity bits on which information compression was carried out by referring to the ratio R that is input from the control information reception unit 209. The LLR discrimination unit 205 inputs the sequence PIp of LLRs that correspond to parity bits on which information compression was not carried out to the turbo decoding unit 206. In addition, the LLR discrimination unit 205 outputs the sequence Hr of LLRs that correspond to parity bits on which information compression was carried out to the external LLR extraction units 208-1 and 208-2. Additionally, a process of the LLR discrimination unit 205 corresponds to a process that is the reverse of the process in the P/S unit 1028 in FIG. 4.

That is, the parity bit sequence on which information compression was not carried out is a bit sequence that the bit discrimination unit 1023 inputs to the P/S unit 1028, and the parity bit sequence on which information compression was carried out is the XOR coded bit sequence H in FIG. 4.

The turbo decoding unit 206 (the decoding unit) performs a turbo decoding process on the sequence SI of LLRs that correspond to systematic bits, which is input from the S/P unit 204, the sequence PIp of LLRs that correspond to parity bits on which information compression was not carried out, which is input from the LLR discrimination unit 205, a sequence Gex of LLRs that is input from the external LLR extraction unit 208-1, and a sequence Fex of LLRs that is input from the external LLR extraction unit 208-2. In this instance, the LLR sequences Fex and Gex are LLR sequences that are formed from LLRs that correspond to parity bits on which information compression was carried out. That is, the LLR sequences Fex and Gex are LLR sequences that correspond to bit sequences that were respectively input from the first interleaving unit 1026-1 and the second interleaving unit 1026-2 in FIG. 4. Additionally, the details of the turbo decoding unit 206 will be given later.

In the present embodiment, the turbo decoding process by the turbo decoding unit 206 and the extraction of external LLRs by the external LLR extraction units 208-1 and 208-2 are repeatedly performed. In other words, the LLR sequences Fex and Gex of parity bits on which information compression was carried out, which are obtained by the external LLR extraction units 208-1 and 208-2 are input to the turbo decoding unit 206. As a result of this, since external information is exchanged between the turbo decoding unit 206, the external LLR extraction unit 208-1 and the external LLR extraction unit 208-2, it is possible to improve a likelihood of a reception signal. As a result of this, in a case in which prior information of the parity bits on which lossy compression is performed due to a repeated process, is suitably obtained, the external LLR extraction units 208-1 and 208-2 may obtain LLRs of XOR coded bits in the manner of lossless compression.

Additionally, in the first repetition, the LLR sequences Fex and Gex of the external LLR extraction units 208-1 and 208-2 may not be obtained. Therefore, the turbo decoding unit 206 performs turbo decoding using the LLR sequences SI and PIp, that is, the LLRs of systematic bits and the LLRs of parity bits, which are not targets of information compression, and which are not punctured. In addition, in the second repetition and thereafter, the turbo decoding unit 206 performs turbo decoding using the LLR sequences SI, PIp, Fex and Gex, that is, the LLRs of systematic bits, the LLRs of parity bits which are not punctured, and the LLRs of parity bits which are targets of information compression.

In the LLR restoration information configuration unit 207, the first parity bit sequence P1 that is obtained by the turbo decoding process, and LLR sequences P1r and P2r (external LLR sequences after decoding) that respectively correspond to the second parity bit sequence P2 are input from the turbo decoding unit 206. In addition, a combined MCS of a coding rate and a modulation method, and a ratio R are input from the control information reception unit 209. The LLR restoration information configuration unit 207 separates sequences Fr and Gr of LLRs that respectively correspond to bit sequences F and G in FIG. 4 from LLR sequences P1r and P2r by referring to the combined MCS of a coding rate and a modulation method and the ratio R. The LLR restoration information configuration unit 207 inputs the LLR sequence Fr to the external LLR extraction unit 208-1, and inputs the LLR sequence Gr to the external LLR extraction unit 208-2. Additionally, the configuration of the LLR restoration information configuration unit 207 will be described later.

The external LLR extraction unit 208-1 (the external information extraction unit) obtains a sequence Gex of LLRs, which correspond to bit sequences that the bit discrimination unit 1024 in FIG. 4 inputs to the first interleaving unit 1026-2, from the LLR sequence Fr that is input from the LLR restoration information configuration unit 207 and the sequence Hr of LLRs that correspond to parity bits on which information compression was carried out, which is input from the LLR discrimination unit 205. That is, the sequence Gex of LLRs is a sequence of LLRs that corresponds to bits among the punctured parity bits which became targets of information compression.

The external LLR extraction unit 208-2 (the external information extraction unit) obtains a sequence Fex of LLRs, which correspond to bit sequences that the bit discrimination unit 1023 in FIG. 4 inputs to the first interleaving unit 1026-1, from the LLR sequence Gr that is input from the LLR restoration information configuration unit 207 and the sequence Hr of LLRs that correspond to parity bits on which information compression was carried out, which is input from the LLR discrimination unit 205. That is, the sequence Fex of LLRs is a sequence of LLRs that corresponds to bits among the parity bits which became targets of information compression.

When the repetition of the processes by the turbo decoding unit 206 and the external LLR extraction units 208-1 and 208-2 has been completed, the hard decision unit 210 creates a decoded data bit sequence B' by making a hard decision of each LLR of an LLR sequence SI' that corresponds to the data bit sequence B that the turbo decoding unit 206 creates.

Additionally, as a completion condition of the repetition of the processes by the turbo decoding unit 206 and the external LLR extraction units 208-1 and 208-2, it is possible to use a factor that is similar to publicly-known factors as the completion condition of turbo decoding such as the repetition having been performed a predetermined number of times.

Figure 9:
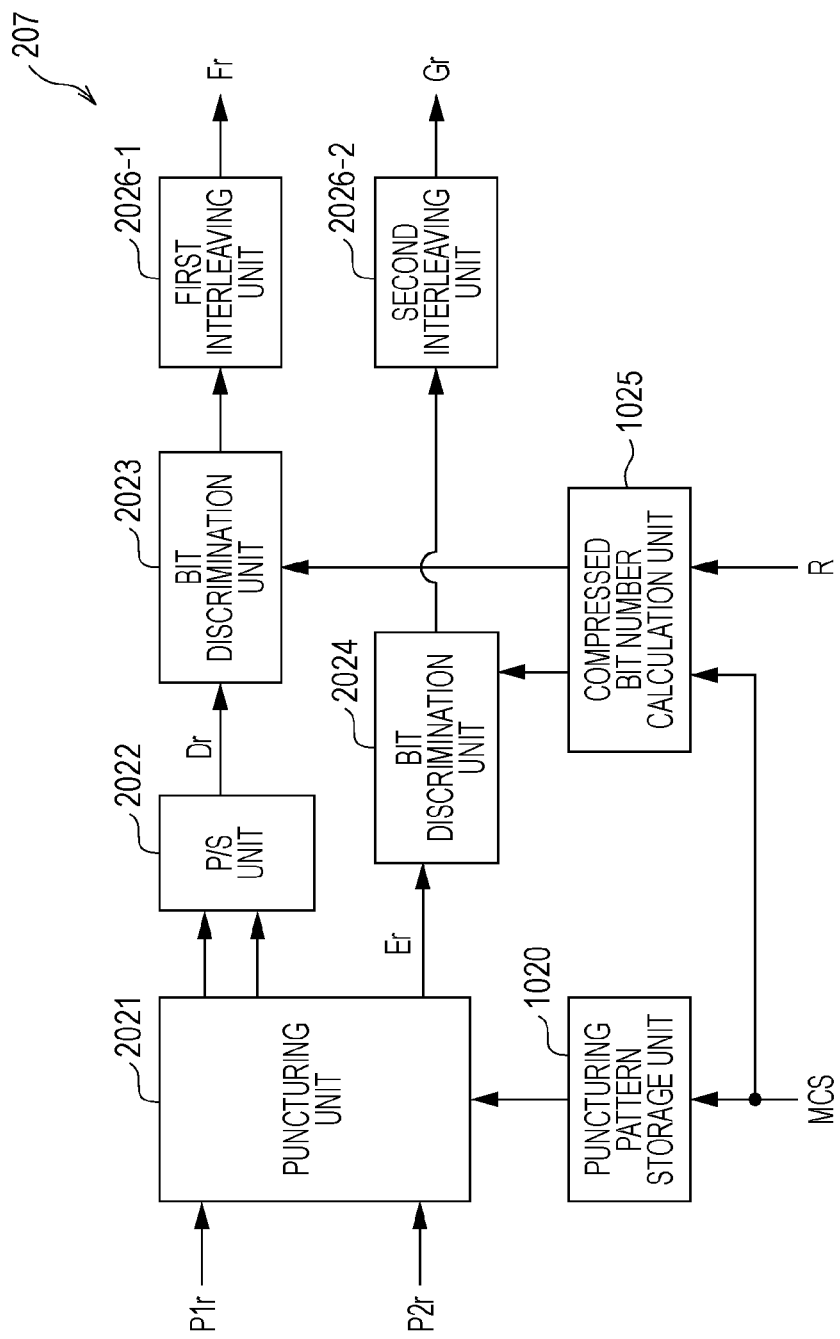
FIG. 9 is a schematic block diagram that illustrates a configuration example of an LLR restoration information configuration unit 207 in the same embodiment.

FIG. 9 is a schematic block diagram that illustrates a configuration example of the LLR restoration information configuration unit 207. As illustrated in FIG. 9, the LLR restoration information configuration unit 207 is configured to include a puncturing unit 2021, a P/S unit 2022, bit discrimination units 2023 and 2024, a first interleaving unit 2026-1, a second interleaving unit 2026-2, the puncturing pattern storage unit 1020, and the compressed bit number calculation unit 1025. In the same diagram, portions that correspond to each portion in FIG. 4 have been given the same symbols (1020 and 1025), and description thereof has been omitted.

The puncturing unit 2021, the P/S unit 2022, the bit discrimination units 2023 and 2024, the first interleaving unit 2026-1, and the second interleaving unit 2026-2 are the same as the puncturing unit 1021, the P/S unit 1022, the bit discrimination units 1023 and 1024, the first interleaving unit 1026-1 and the second interleaving unit 1026-2 in FIG. 4, but differ in that the process targets thereof are LLR sequences rather than bit sequences. That is, the LLR restoration information configuration unit 207 is set to have the same configuration as that of the coding rate control unit 102, and creates sequences Fr and Gr of LLRs that correspond to bit sequences F and G from LLR sequences P1r and P2r that correspond to the first parity bit sequence P1 and the second parity bit sequence P2.

Figure 10:
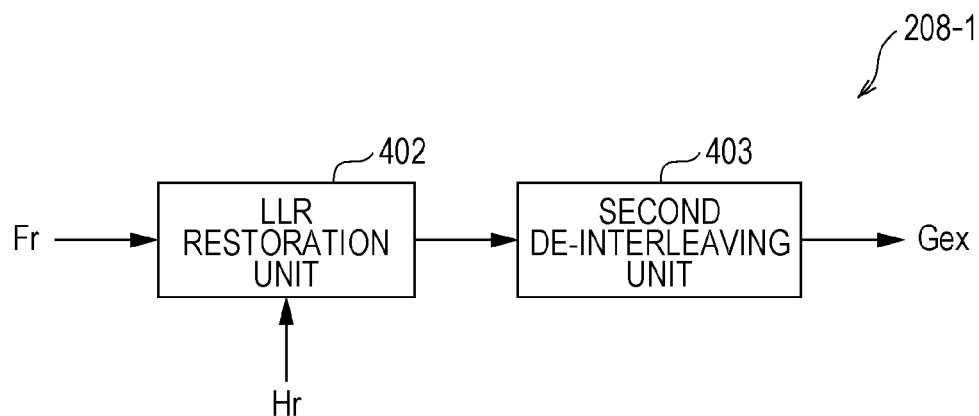
FIG. 10 is a schematic block diagram that illustrates a configuration example of an external LLR extraction unit 208-1 in the same embodiment.

FIG. 10 is a schematic block diagram that illustrates a configuration example of the external LLR extraction unit 208-1. As illustrated in FIG. 10, the external LLR extraction unit 208-1 is configured to include an LLR restoration unit 402 and a second de-interleaving unit 403. The LLR restoration unit 402 calculates an exclusive-OR operation of the LLR sequence Fr that is input from the LLR restoration information configuration unit 207 and the LLR sequence Hr that is input from the LLR discrimination unit 205. As a result of this, a sequence of LLRs that corresponds to a bit sequence G, which is the output of the second interleaving unit 1026-2 in FIG. 4, is obtained. The LLR restoration unit 402 calculates an exclusive-OR operation of P and Q, which are two LLRs, using the following Formula (1).

Equation 1

$$LLR_{P,Q} = \log \frac{e^P + e^Q}{1 + e^{P+Q}} \quad \text{Formula (1)}$$

However, in a case in which the decoding process has not yet been performed, since there are no output LLRs of the turbo decoding unit 206, the output LLRs of the turbo decoding unit 206 is considered to be zero, and therefore, the output of the LLR restoration unit 402 becomes 0.

The second de-interleaving unit 403 carries out realignment, which is the reverse of the realignment by the second interleaving unit 1026-2 in FIG. 4, on LLR sequences that the LLR restoration unit 402 calculates, and outputs the result as the LLR sequence Gex. That is, the second de-interleaving unit 403 becomes a de-interleaver of the second interleaving unit 1026-2. In addition, the LLR sequence Gex becomes an LLR sequence that corresponds to bit sequences that the bit discrimination unit 1024 in FIG. 4 inputs to the second interleaving unit 1026-2.

Figure 11:
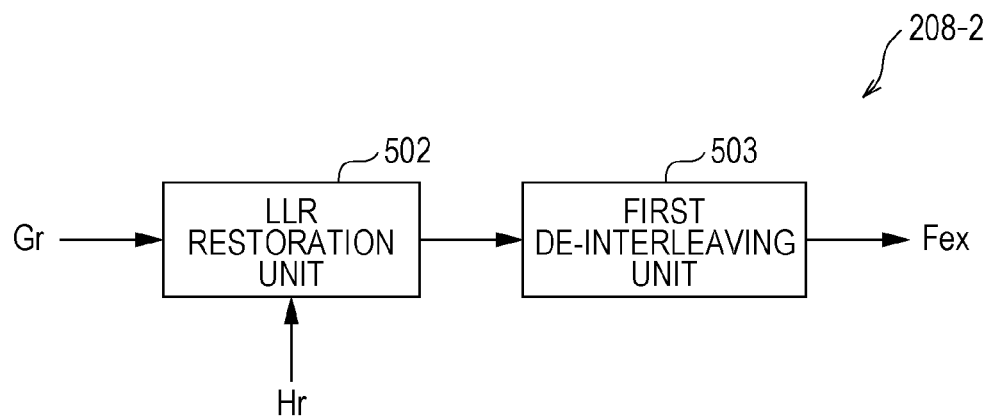
FIG. 11 is a schematic block diagram that illustrates a configuration example of an external LLR extraction unit 208-2 in the same embodiment.

FIG. 11 is a schematic block diagram that illustrates a configuration example of the external LLR extraction unit 208-2. As illustrated in FIG. 11, the external LLR extraction unit 208-2 is configured to include an LLR restoration unit 502 and a first de-interleaving unit 503. The LLR restoration unit 502 calculates an exclusive-OR operation of the LLR sequence Gr that is input from the LLR restoration information configuration unit 207 and the LLR sequence Hr that is input from the LLR discrimination unit 205, in the same manner as the LLR restoration unit 402. As a result of this, a sequence of LLRs that corresponds to a bit sequence F, which is the output of the first interleaving unit 1026-1 in FIG. 4, is obtained. However, in a case in which the decoding process has not yet been performed, the output of the LLR restoration unit 502 is set as zero since there is no output LLRs of the turbo decoding unit 206.

The first de-interleaving unit 503 carries out realignment, which is the reverse of the realignment by the first interleaving unit 1026-1 in FIG. 4, on an LLR sequence that the LLR restoration unit 502 calculates, and outputs the result as the LLR sequence Fex. That is, the first de-interleaving unit 503 becomes a de-interleaver of the first interleaving unit 1026-1. In addition, the LLR sequence Fex becomes an LLR sequence that corresponds to bit sequences that the bit discrimination unit 1023 in FIG. 4 inputs to the first interleaving unit 1026-1.

Figure 12:
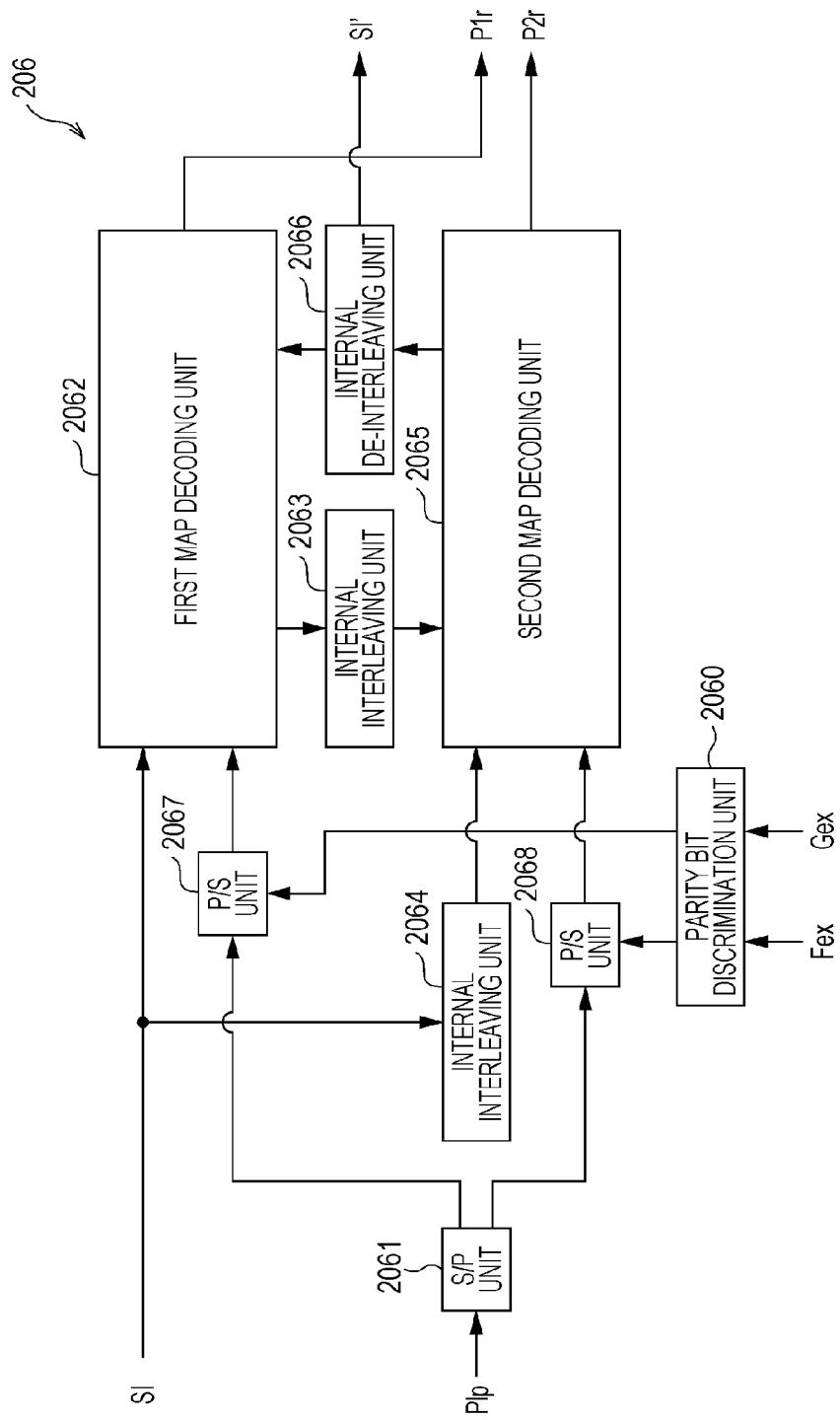
FIG. 12 is a schematic block diagram that illustrates a configuration example of a turbo decoding unit 206 in the same embodiment.

FIG. 12 is a schematic block diagram that illustrates a configuration example of a turbo decoding unit 206. The turbo decoding unit 206 is configured to include a parity bit discrimination unit 2060, an S/P unit 2061, a first MAP (Maximum A Posteriori) decoding unit 2062, internal interleaving units 2063 and 2064, a second MAP decoding unit 2065, an internal de-interleaving unit 2066, and P/S units 2067 and 2068.

The parity bit discrimination unit 2060 inputs LLRs of the LLR sequences Fex and Gex that correspond to first parity bits to the P/S unit 2067, and inputs LLRs that correspond to second parity bits to the P/S unit 2068. The S/P unit 2061 inputs LLRs of the LLR sequence PIp that correspond to first parity bits to the P/S unit 2067, and inputs LLRs that correspond to second parity bits to the P/S unit 2068. The internal interleaving unit 2064 performs the same realignment as that of the internal interleaving unit 1012 in FIG. 3 on the LLR sequence SI, and inputs the realigned LLR sequence to the second MAP decoding unit 2065.

The P/S unit 2067 creates an LLR sequence that corresponds to the first parity bit sequence P1 from the LLR sequence that is input from the S/P unit 2061, and the LLR sequence that is input from the parity bit discrimination unit 2060, and inputs the LLR sequence to the first MAP decoding unit 2062. In this instance, the LLR sequence that is input to the P/S unit 2067 from the S/P unit 2061 is a sequence of LLRs that corresponds to bits of the first parity bit sequence P1 that were not targets of puncturing by puncturing, and were also not targets of information compression.

In addition, the LLR sequence that is input to the P/S unit 2067 from the parity bit discrimination unit 2060 is a sequence of LLRs that corresponds to bits of the first parity bit sequence P1 that were targets of information compression. Bits that were targets of puncturing, and bits that were not targets of puncturing are both included in this LLR sequence. Additionally, when the P/S unit 2067 creates the LLR sequence that corresponds to the first parity bit sequence P1, since LLRs that correspond to bits of the first parity bit sequence P1 that were discarded by the bit discrimination unit 1024 in FIG. 4 are not obtained from the S/P unit 2061 or the parity bit discrimination unit 2060, corresponding bits are set to "0".

The P/S unit 2068 creates an LLR sequence that corresponds to the second parity bit sequence P2 from the LLR sequence that is input from the S/P unit 2061, and the LLR sequence that is input from the parity bit discrimination unit 2060, and inputs the LLR sequence to the second MAP decoding unit 2065. In this instance, the LLR sequence that is input to the P/S unit 2068 from the S/P unit 2061 is a sequence of LLRs that corresponds to bits of the second parity bit sequence P2 that were not targets of puncturing by puncturing, and were also not targets of information compression.

In addition, the LLR sequence that is input to the P/S unit 2068 from the parity bit discrimination unit 2060 is a sequence of LLRs that corresponds to bits of the second parity bit sequence P2 that were targets of information compression. Bits that were targets of puncturing, and bits that were not targets of puncturing are both included in this LLR sequence. When the P/S unit 2068 creates the LLR sequence that corresponds to the second parity bit sequence P2, since LLRs that correspond to bits of the second parity bit sequence P2 that were discarded by the bit discrimination unit 1024 in FIG. 4 are not obtained from the S/P unit 2061 or the parity bit discrimination unit 2060, corresponding bits are set to "0".

The first MAP decoding unit 2062, the internal interleaving unit 2063, the second MAP decoding unit 2065, and the internal de-interleaving unit 2066 perform a turbo decoding process that corresponds to the turbo code unit 101 in FIG. 2.

In a first repetition of a turbo decoding process, the LLR sequence SI that corresponds to systematic bit sequences is input to the first MAP decoding unit 2062 from the S/P unit 204, and an LLR sequence that corresponds to the first parity bit sequence is input to the first MAP decoding unit 2062 from the P/S unit 2067. The first MAP decoding unit 2062 performs a decoding process that corresponds to the first recursive convolutional code unit 1011 in FIG. 3 using the LLR sequences. In the decoding process, it is possible to use a publicly-known method such as a Max-Log-MAP (Maximum A Posteriori) algorithm. The first MAP decoding unit 2062 inputs an external LLR sequence after decoding, which corresponds to systematic bits, to the internal interleaving unit 2063.

In a second repetition of turbo decoding and thereafter, an external LLR sequence that corresponds to systematic bit sequences is input to the first MAP decoding unit 2062 from the internal de-interleaving unit 2066. In a second repetition of turbo decoding and thereafter, the first MAP decoding unit 2062 performs a decoding process using the LLR sequence SI, the external LLR sequence that is input from the internal de-interleaving unit 2066, and an LLR sequence that is input from the P/S unit 2067. The first MAP decoding unit 2062 also inputs an external LLR sequence after decoding, which corresponds to systematic bits, to the internal interleaving unit 2063 on the second time and thereafter. In addition, in the first MAP decoding unit 2062, a time at which the repetitions of the turbo decoding process reaches a predetermined number inputs an LLR sequence after decoding, which corresponds to the first parity bit sequence to the LLR restoration information configuration unit 207 as the LLR sequence P1r.

The internal interleaving unit 2063 performs the same realignment as that of the internal interleaving unit 1012 in FIG. 3 on the external LLR sequence that is input from the first MAP decoding unit 2062, and inputs the realigned result to the second MAP decoding unit 2065.

The internal de-interleaving unit 2066 performs realignment, which is the reverse of that of the internal interleaving unit 1012 in FIG. 3, on an external LLR sequence that is input from the second MAP decoding unit 2065, and inputs the realigned result to the first MAP decoding unit 2062. That is, the internal de-interleaving unit 2066 is a de-interleaver that corresponds to the internal interleaving unit 1012 in FIG. 3 and the internal interleaving unit 2063. Additionally, when a predetermined number of the turbo decoding process and the repetition of processes by the external LLR extraction units 208-1 and 208-2 has been performed, the internal de-interleaving unit 2066 inputs an LLR sequence after decoding, which corresponds to systematic bits, to the hard decision unit 210 as an LLR sequence SI'.

In a first repetition of a turbo decoding process, an LLR sequence that corresponds to systematic bit sequences, which have been interleaved, is input to the second MAP decoding unit 2065 from the internal interleaving unit 2064, and an LLR sequence that corresponds to the second parity bit sequence is input to the second MAP decoding unit 2065 from the P/S unit 2068. The second MAP decoding unit 2065 performs a decoding process that corresponds to the second recursive convolutional code unit 1013 in FIG. 3 using the LLR sequences. In the decoding process, it is possible to use a publicly-known method such as a Max-Log-MAP (Maximum A Posteriori) algorithm. The second MAP decoding unit 2065 inputs an external LLR sequence after decoding, which corresponds to systematic bits that are internally interleaved, to the internal de-interleaving unit 2066.

In a second repetition of turbo decoding and thereafter, an external LLR sequence that corresponds to systematic bit sequences, which are interleaved, is input to the second MAP decoding unit 2065 from the internal interleaving unit 2063. In a second repetition of turbo decoding and thereafter, the second MAP decoding unit 2065 performs a decoding process using an LLR sequence that is input from the internal interleaving unit 2064, an LLR sequence that is input from the internal interleaving unit 2063, and an LLR sequence that is input from the P/S unit 2068. The second MAP decoding unit 2065 also inputs an external LLR sequence after decoding, which corresponds to systematic bits that are interleaved, to the internal de-interleaving unit 2066 on the second time and thereafter. In addition, in the second MAP decoding unit 2065, a time at which the repetitions of the turbo decoding process reaches a predetermined number inputs an LLR sequence after decoding, which corresponds to the second parity bit sequence to the LLR restoration information configuration unit 207 as the LLR sequence P2r.

In the abovementioned manner, since the transmission device 100 performs information compression and transmission a portion of turbo coded bit sequences, in the reception device 200, it is possible to calculate LLRs of bits that were targets of information compression using LLRs of coded bits, which are obtained by a turbo decoding process, and set the LLRs as external information of the turbo decoding process. Therefore, in comparison with turbo coding of the related art in which information compression is not used, a turbo code that uses information compression in the present embodiment improves an error correction capability in a case of the same coding rate. Therefore, it is possible to suppress a deterioration in the error correction capability when a coding rate rises.

Modification Example of First Embodiment

Figure 13:
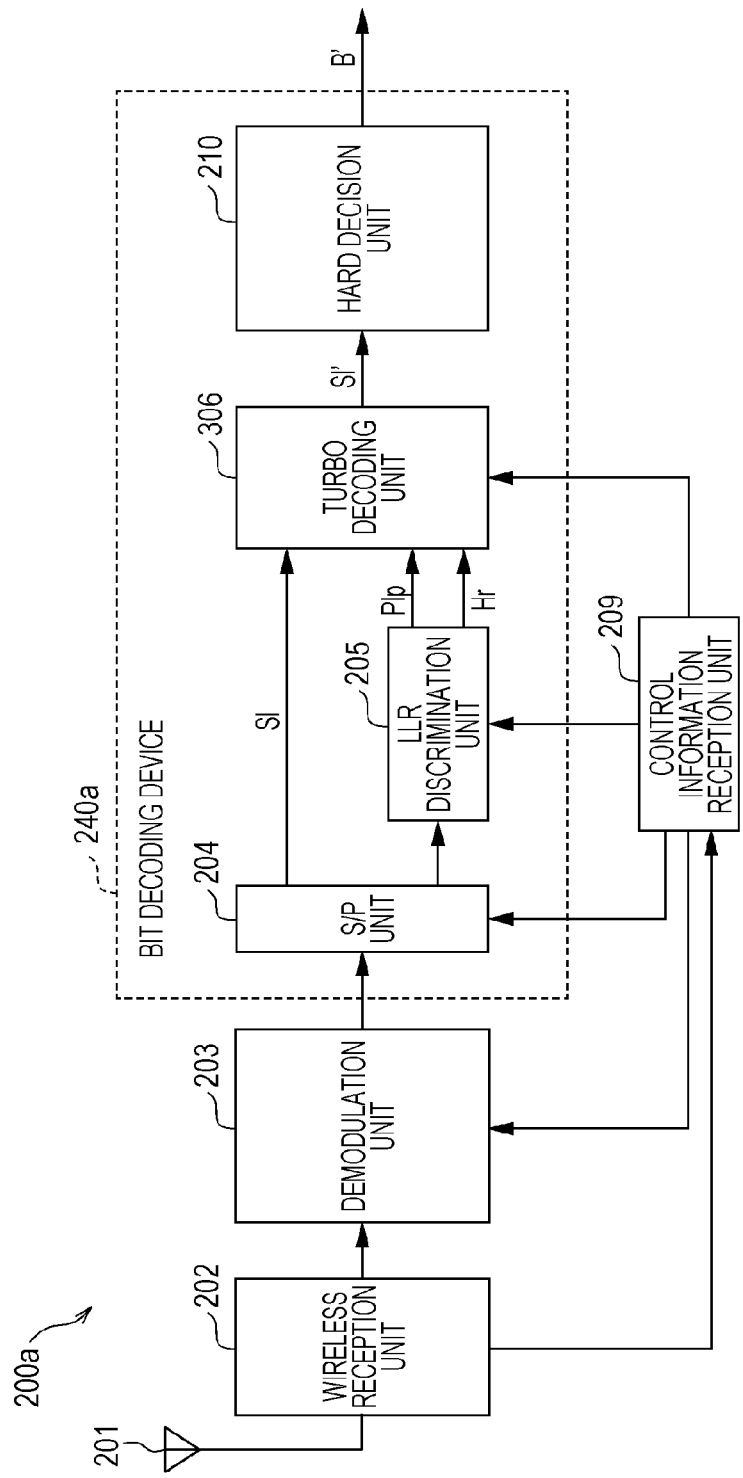
FIG. 13 is a schematic block diagram that illustrates a configuration example of a reception device 200a in a modification example of the same embodiment.

A reception device 200a, which is a modification example of the reception device 200 in the first embodiment will be described. The reception device 200a of the present modification example differs from the reception device 200 in that external LLR extraction is performed for each repetition in the turbo decoding process. FIG. 13 is a schematic block diagram that illustrates a configuration example of the reception device 200a in the present modification example. In the same drawing, portions that correspond to each portion in FIG. 8 have been given the same symbols (201 to 205, 209 and 210), and description thereof has been omitted.

The reception device 200a is configured to include an antenna 201, a wireless reception unit 202, a demodulation unit 203, a bit decoding device 240a, and a control information reception unit 209. The bit decoding device 240a is configured to include an S/P unit 204, an LLR discrimination unit 205, a turbo decoding unit 306, and a hard decision unit 210.

Figure 14:
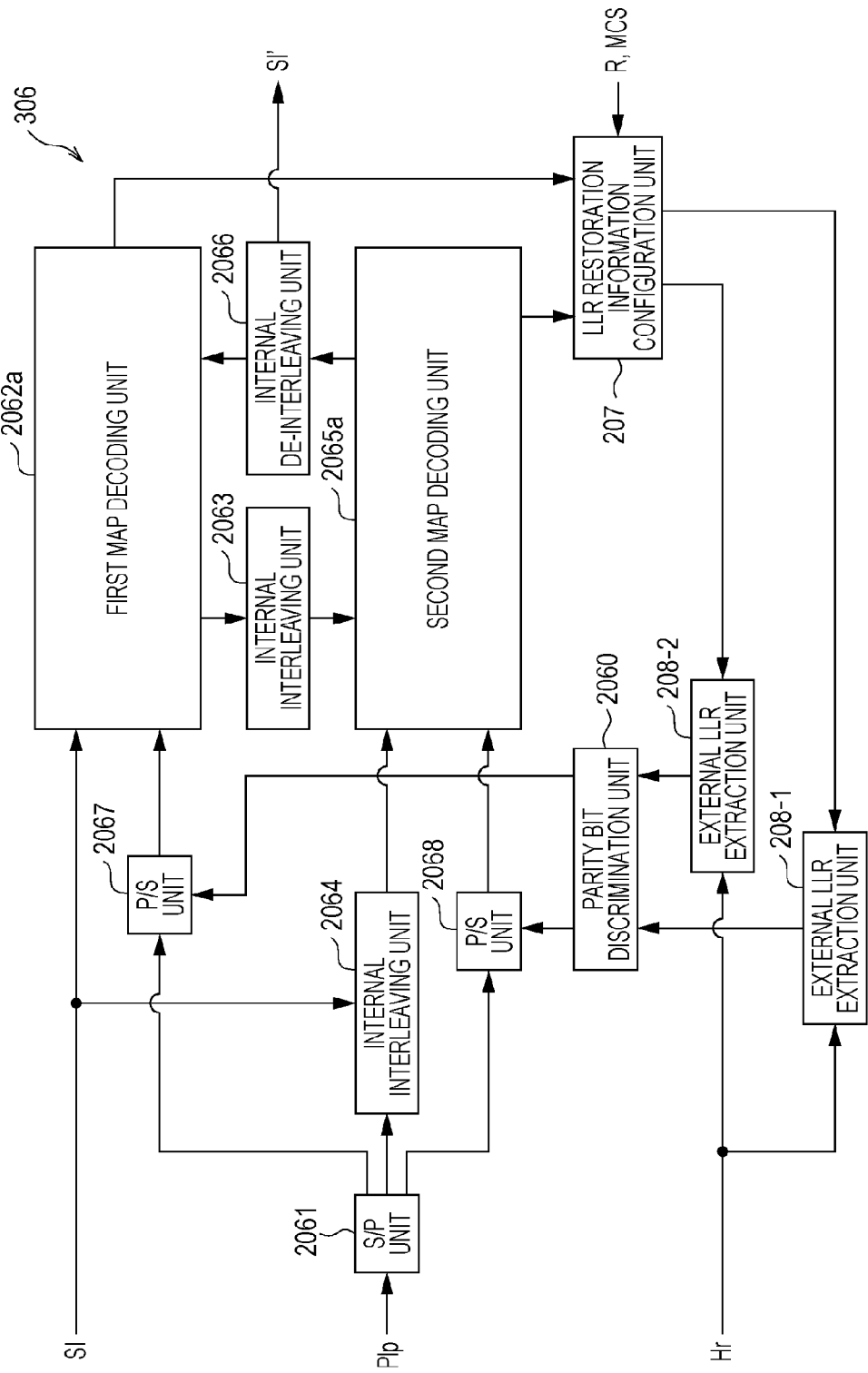
FIG. 14 is a schematic block diagram that illustrates a configuration example of a turbo decoding unit 306 in the same modification example.

FIG. 14 is a schematic block diagram that illustrates a configuration example of a turbo decoding unit 306. In the same drawing, portions that correspond to each portion in FIG. 8 and FIG. 12 have been given the same symbols (2060, 2061, 2063, 2064, 2066 to 2068, 207, 208-1 and 208-2), and description thereof has been omitted. The turbo decoding unit 306 is configured to include a parity bit discrimination unit 2060, an S/P unit 2061, a first MAP decoding unit 2062a, an internal interleaving unit 2063, an internal interleaving unit 1064, a second MAP decoding unit 2065a, an internal de-interleaving unit 2066, and P/S units 2067 and 2068, a LLR restoration information configuration unit 207 and external LLR extraction units 208-1 and 208-2.

The first MAP decoding unit 2062a inputs an LLR sequence that corresponds to the first parity bit sequence to the LLR restoration information configuration unit 207 each time a decoding process, which is different from that of the first MAP decoding unit 2062 in FIG. 12, is performed. In addition, the second MAP decoding unit 2065a inputs an LLR sequence that corresponds to the second parity bit sequence to the LLR restoration information configuration unit 207 each time a decoding process, which is different from that of the second MAP decoding unit 2065 in FIG. 12, is performed. As a result of this, in the present modification example, a likelihood is increased by obtaining external information from LLRs of parity bits on which information compression was carried out each time the turbo decoding process is repeated.

Additionally, a case in bits on which information compression is carried out are parity bits was described, but a configuration in which systematic bits are included in the bits on which information compression is carried out, may be used. In such a case, the transmission device 100 is provided with a bit discrimination unit that separates bits of the systematic bits that are to be a target of information compression, and inputs the separated bits to the information compression unit 1027. In addition, the LLR discrimination unit 205 of the reception device 200 also extracts LLRs that were a target of information compression from the LLR sequence SI that corresponds to systematic bits, and inputs the LLRs to the external LLR extraction units 208-1 and 208-2. In addition, among LLR sequences after decoding that corresponds to systematic bits that the turbo decoding unit 206 creates, the LLR restoration information configuration unit 207 also extracts a sequence of LLRs that corresponds to bits that were targets of information compression, and inputs the sequences to the external LLR extraction unit 208-1. In addition, the turbo decoding unit 206 is provided with a P/S unit that creates a bit sequence that corresponds to systematic bit sequences from LLRs of the LLR sequence SI, which corresponds to systematic bits, that were remaining due to separation by the LLR discrimination unit 205, and LLRs of an LLR sequence that the external LLR extraction unit 208-2 creates, which correspond to systematic bits.

In addition, in the first embodiment, the ratio R may be determined by EXIT analysis. For example, in the first embodiment, in order to perform repetition that exchanges external information that is obtained by the between the external LLR extraction unit 208-1 and the external LLR extraction unit 208-2 that restore compressed information and the turbo decoding unit 206, EXIT analysis is possible depending on EXIT characteristics of the external LLR extraction units 208-1 and 208-2 and EXIT characteristics of the turbo decoding unit 206. Accordingly, the compression control unit 109 determines ratio R so that ratio R does not intersect these EXIT curves. In addition, in the modification examples of the first embodiment, due to the fact that LLRs of bits on which information compression is performed are restored by a repeating mechanism of turbo decoding, repetition of MAP decoding and the external LLR extraction units 208-1 and 208-2 is achieved, and therefore, the compression control unit 109 determines ratio R so that R does not intersect these EXIT curves.

In addition, in the first embodiment and the modification examples thereof, an example in which the transmission device 100 is provided with the compression control unit 109 is described, but the examples are not limited thereto. For example, a configuration in which the reception device 200 is provided with the compression control unit 109, and a ratio R that the compression control unit 109 of the reception device 200 determines is reported to the transmission device 100 as control information, may be used. In the same manner, the reception device 200a may be provided with the compression control unit 109. In addition, a configuration in which the transmission device 100 and the reception device 200 are provided with the compression control unit 109, and a ratio R is determined according to the same rule in the respectively devices, may be used. In addition, the same applied to all other embodiments.

In the abovementioned manner, by compressing and transmitting bit sequences that include bits that were not set as puncturing bits in a case in which a coding rate of turbo coding is set higher than a third, it is possible to obtain a likelihood of bits on which information compression is performed by a reception process. Therefore, it is even possible to improve a coding gain beyond that of puncturing of the related art when the coding rate is the same. As a result of this, it is possible to improve error rate characteristics in comparison with a case in which a high coding rate is realized by puncturing.

Second Embodiment

In the first embodiment, a case in which information compression is performed using an exclusive-OR operation of two bits was described. In the second embodiment, a case in which information compression is performed using an exclusive-OR operation of three bits will be described.

Additionally, a configuration in which information compression is performed using an exclusive-OR operation of four or more bits, may be used. A wireless communication system 10*b* in the present embodiment is configured to include a transmission device 100*b* and a reception device 200*b*. The configuration of the transmission device 100*b* is substantially the same as that of the transmission device 100 in FIG. 2, but differs in a feature of having a coding rate control unit 102*b* in place of the coding rate control unit 102. In addition, the configuration of the reception device 200*b* will be described later.

Figure 15:
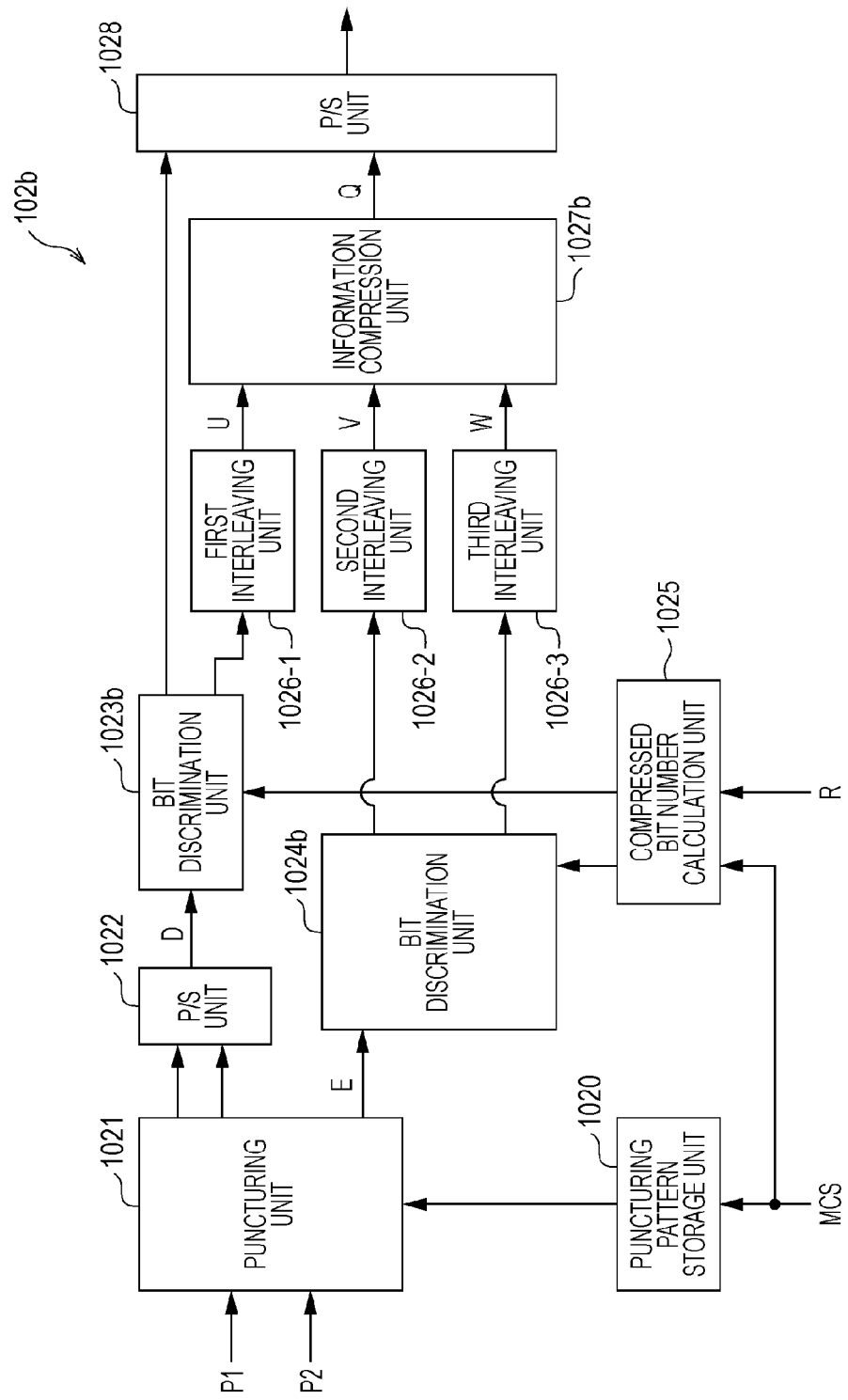
FIG. 15 is a schematic block diagram that illustrates a configuration example of a coding rate control unit 102b according to a second embodiment of the invention.

FIG. 15 is a schematic block diagram that illustrates a configuration example of the coding rate control unit 102*b* in the present embodiment. In the same drawing, portions that correspond to each portion in FIG. 4 have been given the same symbols (1020 to 1022, 1025, 1026-1, 1026-2 and 1028), and description thereof has been omitted. As illustrated in FIG. 15, the coding rate control unit 102*b* is configured to include a puncturing pattern storage unit 1020, a puncturing unit 1021, a P/S unit 1022, a bit discrimination unit 1023*b* and a bit discrimination unit 1024*b*, a compressed bit number calculation unit 1025, a first interleaving unit 1026-1, a second interleaving unit 1026-2, a third interleaving unit 1026-3, an information compression unit 1027*b* and a P/S unit 1028.

The bit discrimination unit 1023*b* sets bits of a compressed bit number that is input from the compressed bit number calculation unit 1025 as compression target bits and separates the compression target bits from the parity bit sequence D that is input from the P/S unit 1022. The bit discrimination unit 1023*b* inputs the separated compression target bits to the first interleaving unit 1026-1, and inputs the remaining non-compression target bits to the P/S unit 1028. A bit selection method with which the bit discrimination unit 1023*b* outputs to the P/S unit 1028 or the first interleaving unit 1026-1 is the same as that of the bit discrimination unit 1023.

The bit discrimination unit 1024*b* sets twice the bits of a compressed bit number that is input from the compressed bit number calculation unit 1025 as compression target bits and separates the compression target bits from the bit sequences E that are input from the puncturing unit 1021. The bit discrimination unit 1024*b* inputs a third of the compression target bits to the second interleaving unit 1026-2, and inputs the remainder to the third interleaving unit 1026-3. The bit discrimination unit 1024*b* discards non-compression target bits that were not separated.

The third interleaving unit 1026-3 realigns parity bit sequences that are input from the bit discrimination unit 1024*b* using a realignment pattern, which is different to that of the first interleaving unit 1026-1 and the second interleaving unit 1026-2. Additionally, the realignment pattern of the third interleaving unit 1026-3 is also already known by the reception device 200*b*, or alternatively, the realignment pattern of the third interleaving unit 1026-3 is reported to the reception device 200.

Interleaved bit sequences U, V and W that are realigned by the first interleaving unit 1026-1, the second interleaving unit 1026-2 and the third interleaving unit 1026-3 are input to the information compression unit 1027*b*. The bit numbers of these three bit sequences are respectively a third of the compression bit numbers, and are the same. The information compression unit 1027*b* calculates an exclusive-OR operation of the interleaved bit sequences U, V and W, and carries out information compression thereof. The information compression unit 1027*b* inputs a XOR coded bit sequence Q that is calculated by the exclusive-OR operation to the P/S unit 1028.

Figure 16:
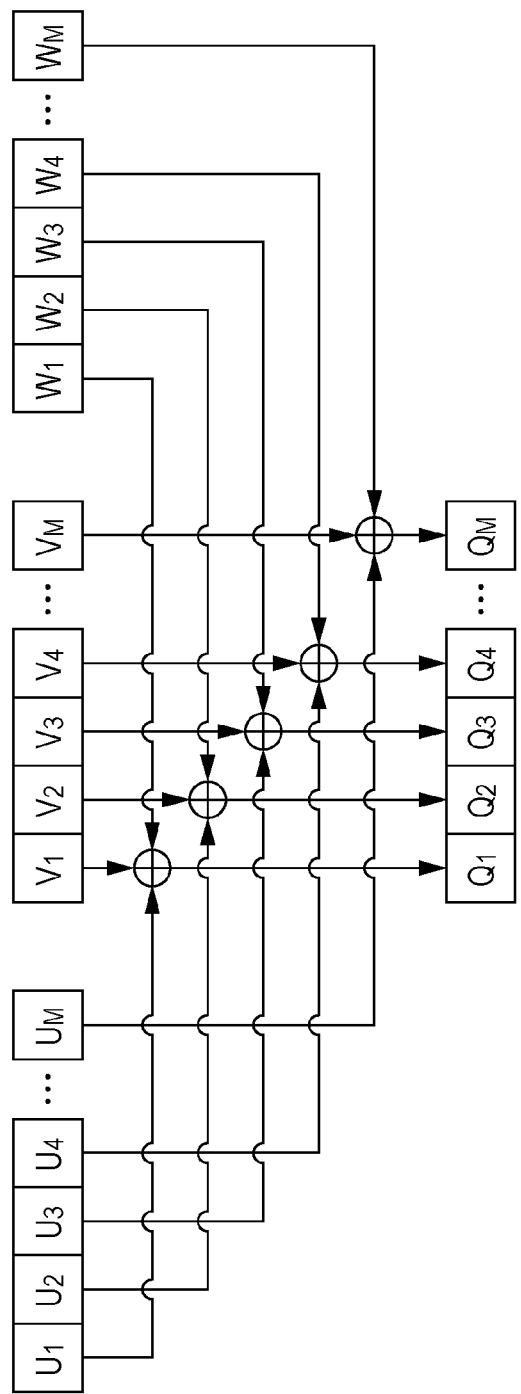
FIG. 16 is a diagram that illustrates an action of an information compression unit 1027b in the same embodiment.

FIG. 16 is a diagram that describes an action of the information compression unit 1027*b*. As illustrated in FIG. 16, an $i^{th}$ bit $Q_i$ of the XOR coded bit sequence Q is an exclusive-OR operation of an $i^{th}$ bit $U_i$ of the bit sequence U, an $i^{th}$ bit $V_i$ of the bit sequence V, and an $i^{th}$ bit $W_i$ of the bit sequence W.

Figure 17:
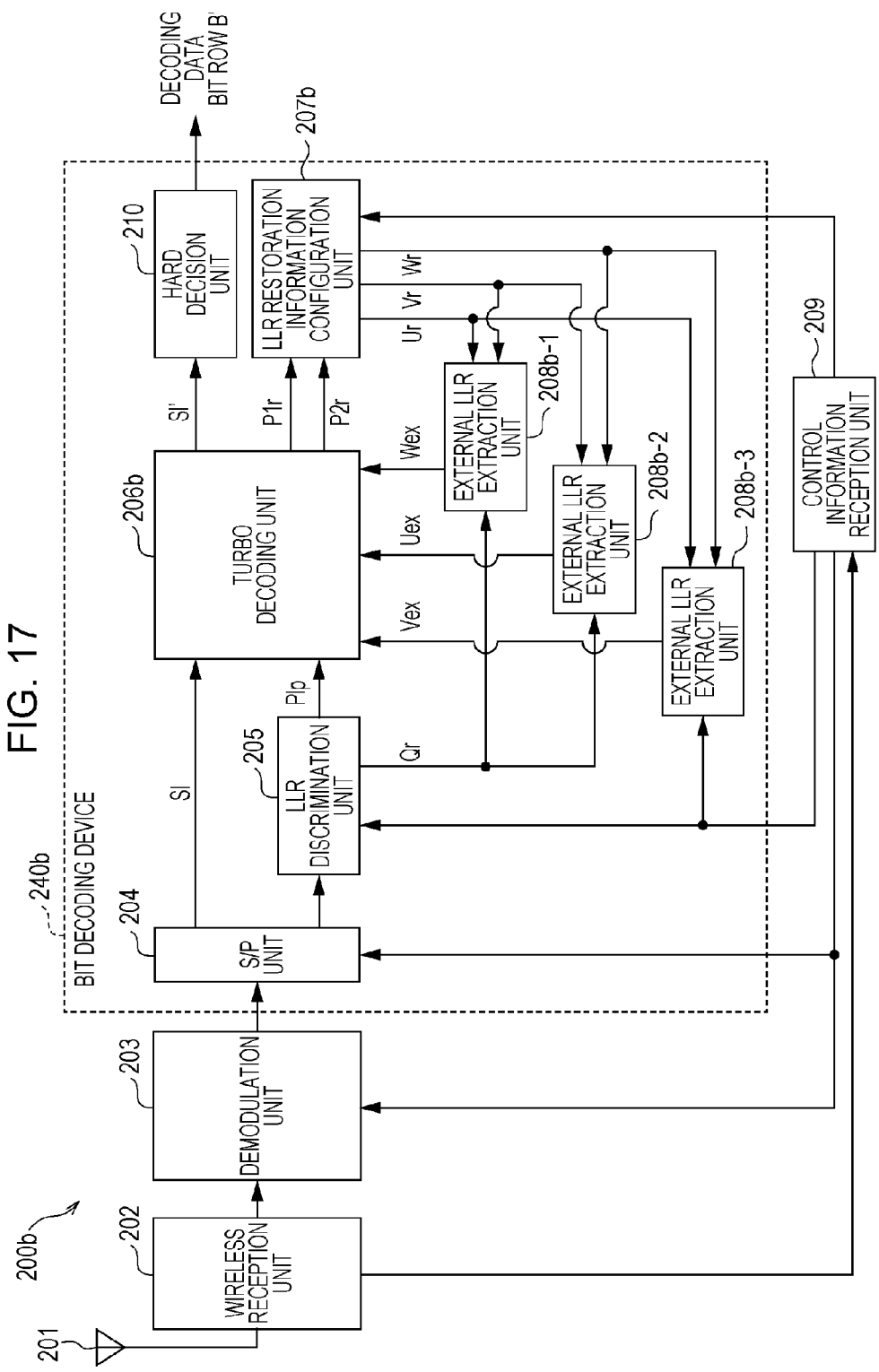
FIG. 17 is a schematic block diagram that illustrates a configuration example of a reception device 200b in the same embodiment.

FIG. 17 is a schematic block diagram that illustrates a configuration example of the reception device 200*b*. In the same drawing, portions that correspond to each portion in FIG. 8 have been given the same symbols (201 to 205, 209 and 210), and description thereof has been omitted. Additionally, in the LLR discrimination unit 205 in FIG. 17, a symbol Qr that differs from FIG. 8 is given to an LLR sequence that is input to external LLR extraction units 208*b*-1, 208*b*-2 and 208*b*-3. The LLR sequence Qr is an LLR sequence that corresponds to a bit sequence Q on which information compression was carried out in FIG. 15. As illustrated in FIG. 17, the reception device 200*b* is configured to include an antenna 201, a wireless reception unit 202, a demodulation unit 203, a bit decoding device 240*b*, and a control information reception unit 209. The bit decoding device 240*b* is configured to include an S/P unit 204, an LLR discrimination unit 205, a turbo decoding unit 206*b*, an LLR restoration information configuration unit 207*b*, external LLR extraction units 208-1, 208-2 and 208-3, and a hard decision unit 210.

The turbo decoding unit 206*b* performs a turbo decoding process using the sequence SI of LLRs that correspond to systematic bits, which is input from the S/P unit 204, the sequence PIp of LLRs that correspond to parity bits on which information compression was not carried out, which is input from the LLR discrimination unit 205, a sequence Wex of LLRs that is input from the external LLR extraction unit 208*b*-1, a sequence Uex of LLRs that is input from the external LLR extraction unit 208*b*-2, and a sequence Vex of LLRs that is input from the external LLR extraction unit 208*b*-3. In this instance, the LLR sequences Uex, Vex and Wex are LLR sequences that are formed from LLRs of parity bits on which information compression was carried out. That is, the LLR sequences Uex, Vex and Wex are LLR sequences that correspond to bit sequences that were respectively input by the first interleaving unit 1026-1, the second interleaving unit 1026-2 and the third interleaving unit 1026-3 in FIG. 15. Additionally, the details of the turbo decoding unit 206*b* will be given later.

The LLR restoration information configuration unit 207*b* separates LLR sequences Ur, Vr and Wr that respectively correspond to the bit sequences U, V and W from the first parity bit sequence P1 that the turbo decoding unit 206 creates, and the LLR sequences P1r and P2r that respectively correspond to the second parity bit sequence P2 by setting in the same manner as the coding rate control unit 102*b* in FIG. 15.

The external LLR extraction unit 208*b*-1 creates the LLR sequence Wex by performing de-interleaving that corresponds to the third interleaving unit 1026-3 after creating an LLR sequence that corresponds to the bit sequence W by calculating an exclusive-OR operation of the LLR sequences Ur, Vr and Qr. The external LLR extraction unit 208b-2 creates the LLR sequence Uex by performing de-interleaving that corresponds to the first interleaving unit 1026-1 after creating an LLR sequence that corresponds to the bit sequence U by calculating an exclusive-OR operation of the LLR sequences Vr, Wr and Qr. The external LLR extraction unit 208b-3 creates the LLR sequence Vex by de-performing interleaving that corresponds to the second interleaving unit 1026-2 after creating an LLR sequence that corresponds to the bit sequence V by calculating an exclusive-OR operation of the LLR sequences Ur, Wr and Qr.

Figure 18:
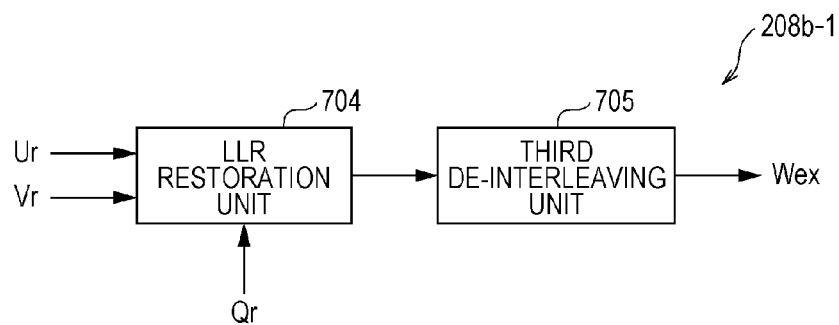
FIG. 18 is a schematic block diagram that illustrates a configuration example of an external LLR extraction unit 208b-1 in the same embodiment.

FIG. 18 is a schematic block diagram that illustrates a configuration example of an external LLR extraction unit 208b-1. As illustrated in FIG. 18, the external LLR extraction unit 208b-1 is configured to include an LLR restoration unit 704 and a third de-interleaving unit 705. The LLR restoration unit 704 calculates an exclusive-OR operation of the LLR sequences Ur, Wr and Qr. The LLR restoration unit 704 calculates an exclusive-OR operation of the LLR sequences Ur, Wr, and Qr by calculating an exclusive-OR operation of the LLR sequences Ur and Wr, and the LLR sequence Qr using Formula (2).

Equation 2

$$LLR_{U,V,Q} = \log\frac{e^U + e^V + e^Q + e^{U+V+Q}}{1 + e^{U+V} + e^{U+Q} + e^{V+Q}} \quad \text{Formula (2)}$$

The third de-interleaving unit 705 creates the LLR sequence Wex by performing realignment, which is the reverse of the realignment by the third interleaving unit 1026-3 in FIG. 15, on a calculation result of the LLR restoration unit 704.

Figure 19:
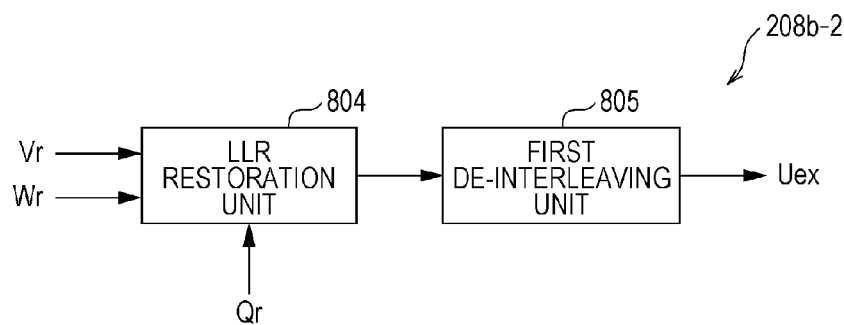
FIG. 19 is a schematic block diagram that illustrates a configuration example of an external LLR extraction unit 208b-2 in the same embodiment.

FIG. 19 is a schematic block diagram that illustrates a configuration example of an external LLR extraction unit 208b-2. As illustrated in FIG. 19, the external LLR extraction unit 208b-2 is configured to include an LLR restoration unit 804 and a first de-interleaving unit 805. The LLR restoration unit 804 calculates an exclusive-OR operation of the LLR sequences Vr, Wr, and Qr. The LLR restoration unit 804 calculates an exclusive-OR operation of the LLR sequences Vr, Wr, and Qr by calculating an exclusive-OR operation of the LLR sequences Vr and Wr, and the LLR sequence Qr using a version of Formula (2) in which instances of U are substituted with W. The first de-interleaving unit 805 creates the LLR sequence Uex by performing realignment, which is the reverse of the realignment by the first interleaving unit 1026-1 in FIG. 15, on a calculation result of the LLR restoration unit 804.

Figure 20:
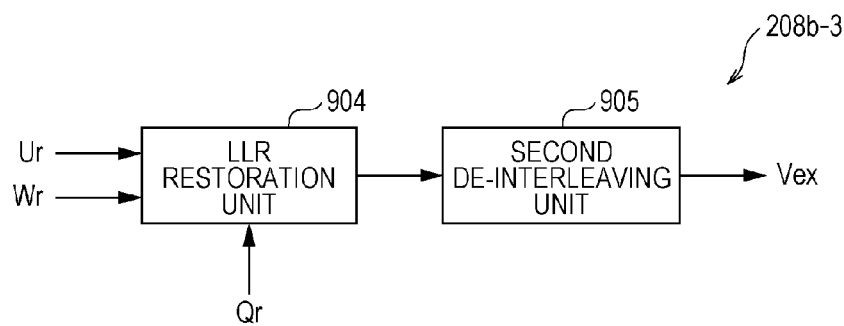
FIG. 20 is a schematic block diagram that illustrates a configuration example of an external LLR extraction unit 208b-3 in the same embodiment.

FIG. 20 is a schematic block diagram that illustrates a configuration example of an external LLR extraction unit 208b-3. As illustrated in FIG. 20, the external LLR extraction unit 208b-3 is configured to include an LLR restoration unit 904 and a second de-interleaving unit 905. The LLR restoration unit 904 calculates an exclusive-OR operation of the LLR sequences Ur, Wr, and Qr. The LLR restoration unit 904 calculates an exclusive-OR operation of the LLR sequences Ur, Wr, and Qr by calculating an exclusive-OR operation of the LLR sequences Ur and Wr, and the LLR sequence Qr using a version of Formula (2) in which instances of V are substituted with W. The second de-interleaving unit 905 creates the LLR sequence Vex by performing realignment, which is the reverse of the realignment by the second interleaving unit 1026-2 in FIG. 15, on a calculation result of the LLR restoration unit 904.

Figure 21:
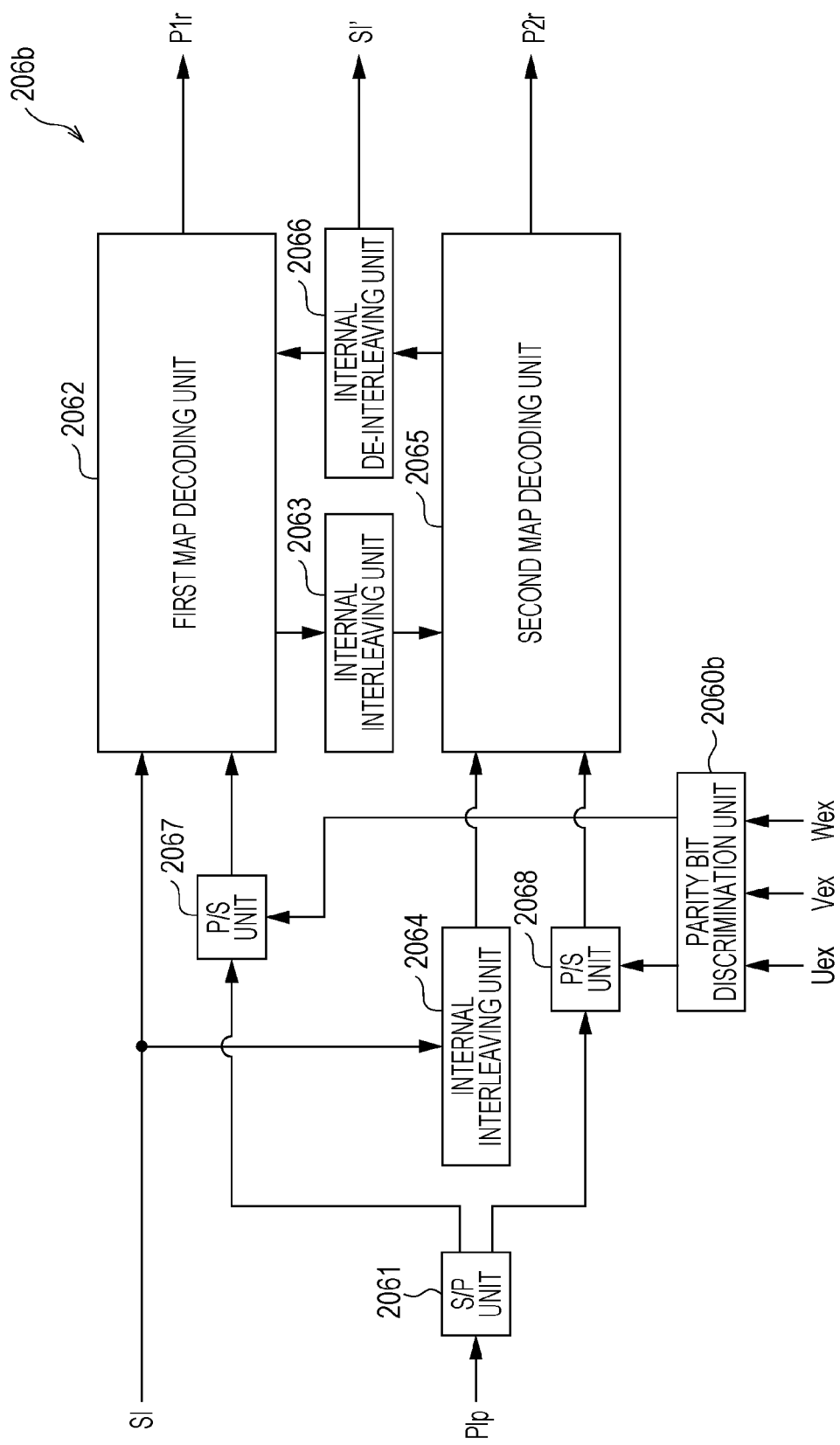
FIG. 21 is a schematic block diagram that illustrates a configuration example of a turbo decoding unit 206b in the same embodiment.

FIG. 21 is a schematic block diagram that illustrates a configuration example of the turbo decoding unit 206b. In the same drawing, portions that correspond to each portion in FIG. 12 have been given the same symbols (2061 to 2068), and description thereof has been omitted. As illustrated in FIG. 21, the turbo decoding unit 206b is configured to include a parity bit discrimination unit 2060b, an S/P unit 2061, a first MAP decoding unit 2062, internal interleaving units 2063 and 2064, a second MAP decoding unit 2065, an internal de-interleaving unit 2066, and P/S units 2067 and 2068.

The parity bit discrimination unit 2060b inputs LLRs of the LLR sequences Uex, Vex and Wex that correspond to first parity bits to the P/S unit 2067, and inputs LLRs that correspond to second parity bits to the P/S unit 2068.

In the abovementioned manner, since the transmission device 100b performs information compression and transmission of a portion of turbo coded bit sequences, in the reception device 200b, it is possible to calculate LLRs of bits that were targets of information compression using LLRs of coded bits, which are obtained by a turbo decoding process, and set the LLRs as external information of the turbo decoding process. Therefore, in the present embodiment, in the same manner as the first embodiment, the error correction capability is also improved to a greater extent than that of the related art in a case of the same coding rate. Therefore, it is possible to suppress a deterioration in the error correction capability when a coding rate rises.

In addition, in the present embodiment, since information compression of three bits into one bit is performed, even if the coding rate is the same, it is possible to increase the LLRs that are set as external information beyond the first embodiment. Therefore, it is possible to improve the error correction capability beyond the first embodiment.

Third Embodiment

In the third embodiment, a case in which the ratio R of parity bits on which information compression is carried out is determined based on retransmission control information will be explained. A wireless communication system 10c in the present embodiment is configured to include a transmission device 100c and a reception device 200c.

Figure 22:
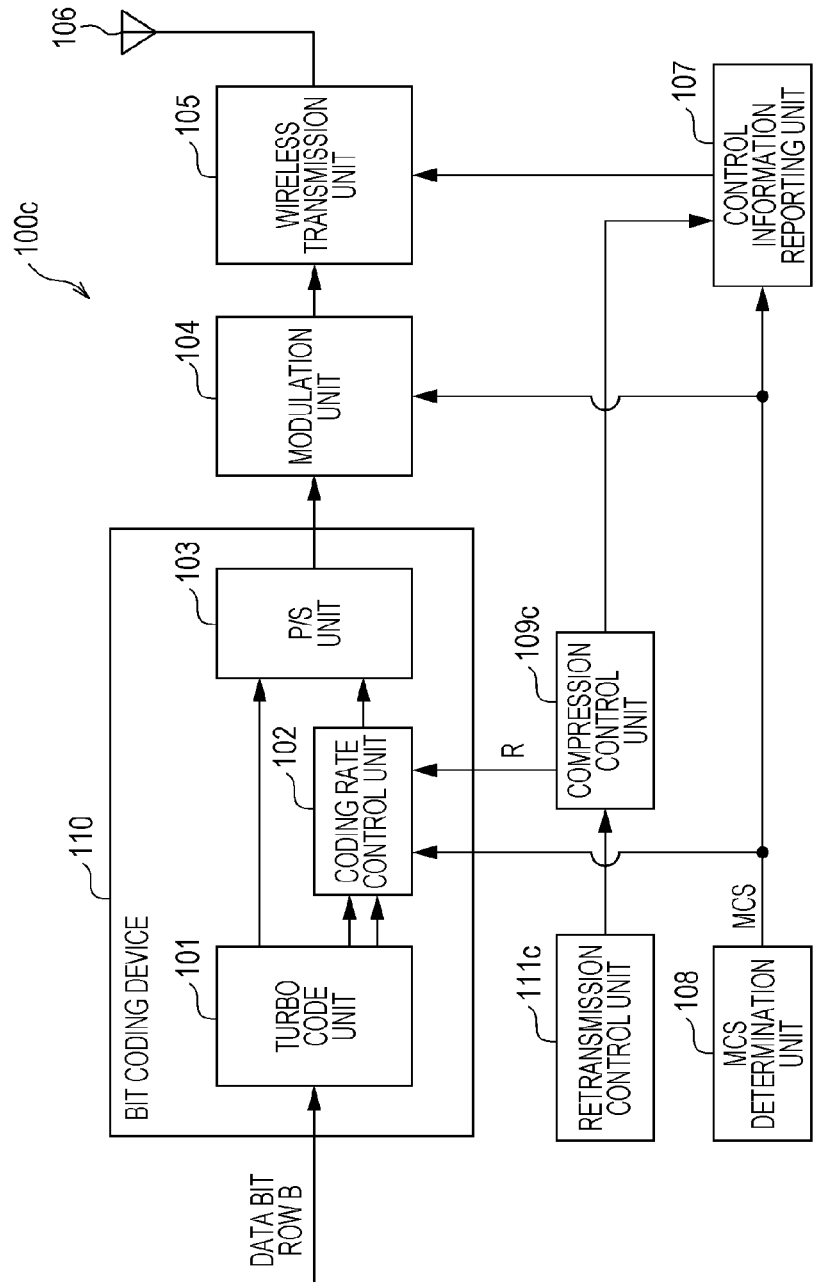
FIG. 22 is a schematic block diagram that illustrates a configuration example of a transmission device 100c according to a third embodiment of the invention.

FIG. 22 is a schematic block diagram that illustrates a configuration example of the transmission device 100c in the present embodiment. In the same drawing, portions that correspond to each portion in FIG. 2 have been given the same symbols (101 to 108 and 110), and description thereof has been omitted. The transmission device 100c is configured to include a bit coding device 110, a modulation unit 104, a wireless transmission unit 105, an antenna 106, a control information reporting unit 107, an MCS determination unit MC, and a transmission control unit 111c.

The retransmission control unit 111c controls retransmission when transmitting the data bit sequence B using an ACKnowledgement (ACK) signal, a Negative ACKnowledgement (NACK) signal or the like that a reception unit that is not illustrated in the drawing in FIG. 22 receives from the reception device 200c. The retransmission control unit 111c reports retransmission control information that includes information that indicates whether a data bit sequence B that is being transmitted is an initial transmission or a retransmission, and information that indicates a number of times of retransmission when the data bit sequence B that is being transmitted is a retransmission to the compression control unit 109c.

The compression control unit 109c determines a ratio R of parity bits on which information compression was carried out by referring to the retransmission control information that is reported from the retransmission control unit 111c, and reports to the coding rate control unit 102. For example, the compression control unit 109c sets values that are respectively stored in advance in association with initial transmission and retransmission as R depending on whether or not transmission is initial transmission or retransmission by referring to retransmission control information. More specifically, in a case in which a ratio of parity bits on which information compression is carried out during initial transmission is set as $R_1$, and ratios of parity bits on which information compression is carried out during retransmissions are set as $R_n$, $R_1 < R_n$. In addition, the ratio $R_n$ of the parity bits on which information compression is carried out may be determined depending on a number of times of retransmission. For example, p<q is set, and ratios $R_p$ and $R_q$ of parity bits on which information compression is carried out of a $p^{th}$ and a $q^{th}$ time of retransmission are set so that $R_p < R_q$.

Figure 23:
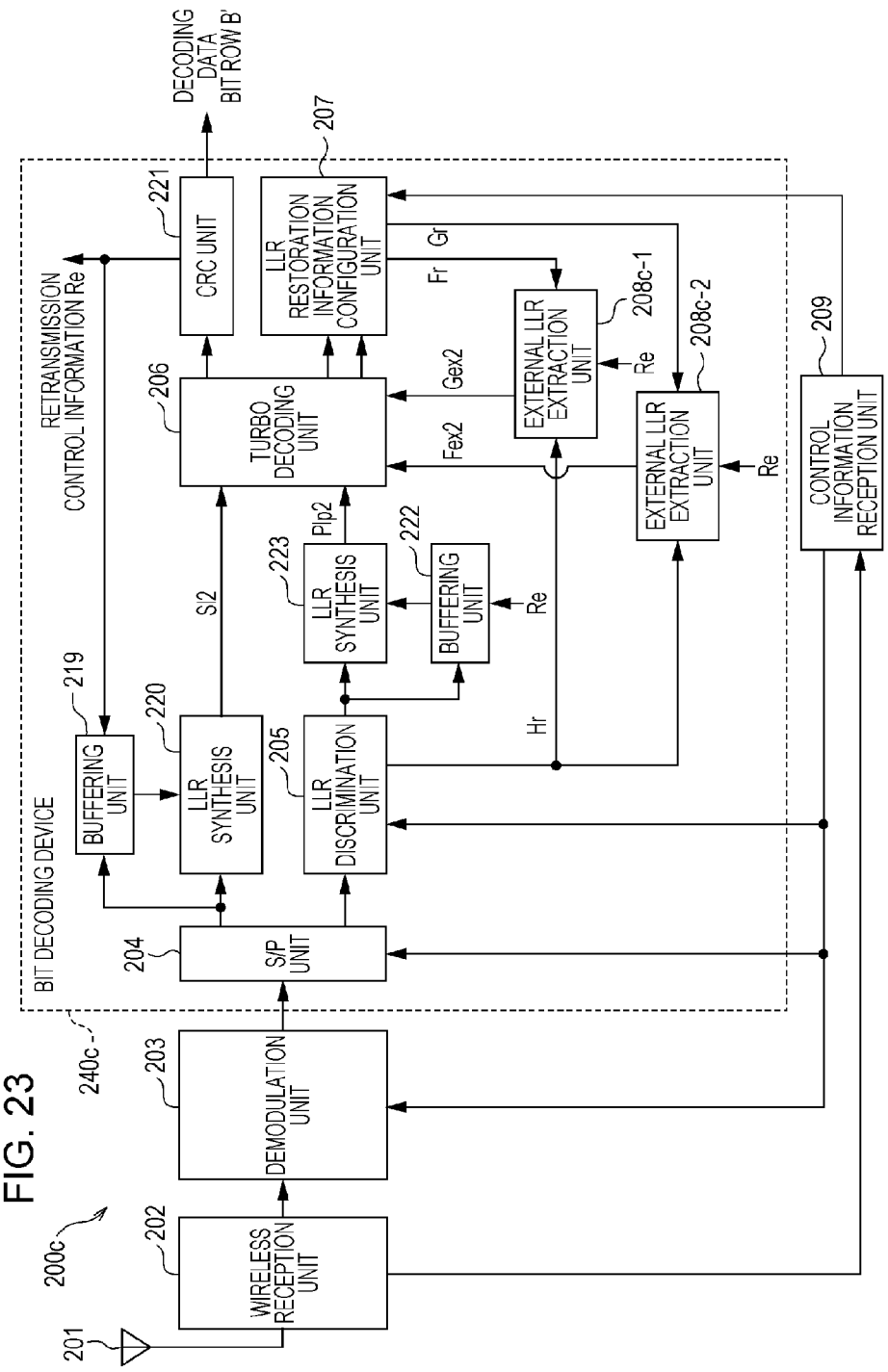
FIG. 23 is a schematic block diagram that illustrates a configuration example of a reception device 200c in the same embodiment.

FIG. 23 is a schematic block diagram that illustrates a configuration example of the reception device 200c. In the same drawing, portions that correspond to each portion in FIG. 8 have been given the same symbols (201 to 207 and 209), and description thereof has been omitted. As illustrated in FIG. 23, the reception device 200c is configured to include an antenna 201, a wireless reception unit 202, a demodulation unit 203, a bit decoding device 240c, and a control information reception unit 209. The bit decoding device 240c is configured to include an S/P unit 204, an LLR discrimination unit 205, a turbo decoding unit 206, an LLR restoration information configuration unit 207, external LLR extraction units 208c-1 and 208c-2, a buffering unit 219, an LLR synthesis unit 220, a CRC unit 221, a buffering unit 222, and an LLR synthesis unit 223.

An LLR sequence that corresponds to systematic bits that the S/P unit 204 separates is input to the buffering unit 219. The buffering unit 219 stores the input LLR sequence. When retransmission control information Re that is input from the CRC unit 221 is ACK, which indicates that it was possible to accurately detect a reception signal, the buffering unit 219 deletes the stored LLR sequence. In addition, when the retransmission control information Re is NACK, which indicates that it was not possible to accurately detect a reception signal, the buffering unit 219 stores the stored LLR sequence until a reception time of a retransmission signal. The buffering unit 219 inputs the stored LLR sequence to the LLR synthesis unit 220 when a retransmission signal is received, and inputs zero to the LLR synthesis unit 220 when an initial transmission signal is received.

When a retransmission signal is received, the LLR synthesis unit 220 creates a synthesized LLR sequence by adding an LLR sequence that corresponds to systematic bits that is input from the S/P unit 204, and an LLR sequence of an initial transmission signal or a prior retransmission signal that the buffering unit 219 is storing. The LLR synthesis unit 220 sets the synthesized LLR sequence to a sequence S12 of LLRs that correspond to systematic bits, and inputs the sequence S12 of LLRs to the turbo decoding unit 206. Additionally, when an initial transmission signal is received, since zero in input by the buffering unit 219, the LLR synthesis unit 220 sets an LLR sequence that corresponds to systematic bits that is input from the S/P unit 204 as the sequence S12 of LLRs that corresponds to systematic bits, and inputs the sequence S12 of LLRs to the turbo decoding unit 206.

The buffering unit 222 and the LLR synthesis unit 223 perform the same processes as the buffering unit 219 and the LLR synthesis unit 220 on a sequence PIp LLRs that correspond to parity bits, which the LLR discrimination unit 205 separated, and on which information compression was not carried out. The LLR synthesis unit 223 sets a synthesized LLR sequence as an LLR sequence PIp2 that corresponds to parity bits on which information compression was not carried out, and inputs the LLR sequence PIp2 to the turbo decoding unit 206.

The external LLR extraction unit 208c-1 calculates an exclusive-OR operation of an LLR sequence $Hr_1$ of a reception signal of initial transmission, and an LLR sequence Fr, and an exclusive-OR operation of an LLR sequence $Hr_2$ of a reception signal of retransmission, and an LLR sequence Fr. After synthesizing calculation results of the exclusive-OR, the external LLR extraction unit 208c-1 performs realignment, which is the reverse of the realignment by the second interleaving unit 1026-2 in FIG. 8, and inputs the result to the turbo decoding unit 206 as an LLR sequence Gex2. However, when an initial transmission signal is received, the external LLR extraction unit 208c-1 performs the same processes as the external LLR extraction unit 208-1 in FIG. 8.

The external LLR extraction unit 208c-2 calculates an exclusive-OR operation of an LLR sequence $Hr_1$ of a reception signal of initial transmission, and an LLR sequence Gr, and an exclusive-OR operation of an LLR sequence $Hr_2$ of a reception signal of retransmission, and an LLR sequence Gr. After synthesizing calculation results of the exclusive-OR, the external LLR extraction unit 208c-2 performs realignment, which is the reverse of the realignment by the first interleaving unit 1026-1 in FIG. 8, and inputs the result to the turbo decoding unit 206 as an LLR sequence Fex2. However, when an initial transmission signal is received, the external LLR extraction unit 208c-2 performs the same processes as the external LLR extraction unit 208-2 in FIG. 8.

The CRC unit 221 performs conversion into a decoded data bit sequence B' by making a hard decision of the LLRs of systematic bits that the turbo decoding unit 206 creates. The CRC unit 221 checks the presence or absence of errors by performing a Cyclic Redundancy Check (CRC) on the decoded data bit sequence B'. When there are no errors, in addition to transmitting an ACK signal as the retransmission control information Re to the transmission device 100c from a transmission unit that is not illustrated in the drawings, the CRC unit 221 outputs the decoded data bit sequence B' as a decoding result. In addition, when there are errors, the CRC unit 221 transmits NACK as the retransmission control information Re to the transmission device 100c from a transmission unit that is not illustrated in the drawings. Furthermore, the CRC unit 221 also inputs the retransmission control information Re to the buffering units 219 and 222, and the external LLR extraction units 208c-1 and 208c-2 for utilizing the retransmission control information Re in the reception process.

Additionally, the turbo decoding unit 206 is the same as the turbo decoding unit 206 in FIG. 8, but the LLR sequence SI2 is input in place of the LLR sequence SI, the LLR sequence PIp2 is input in place of the LLR sequence PIp, the LLR sequence Fex2 is input in place of the LLR sequence Fex, and the LLR sequence Gex2 is input in place of the LLR sequence Gex.

Figure 24:
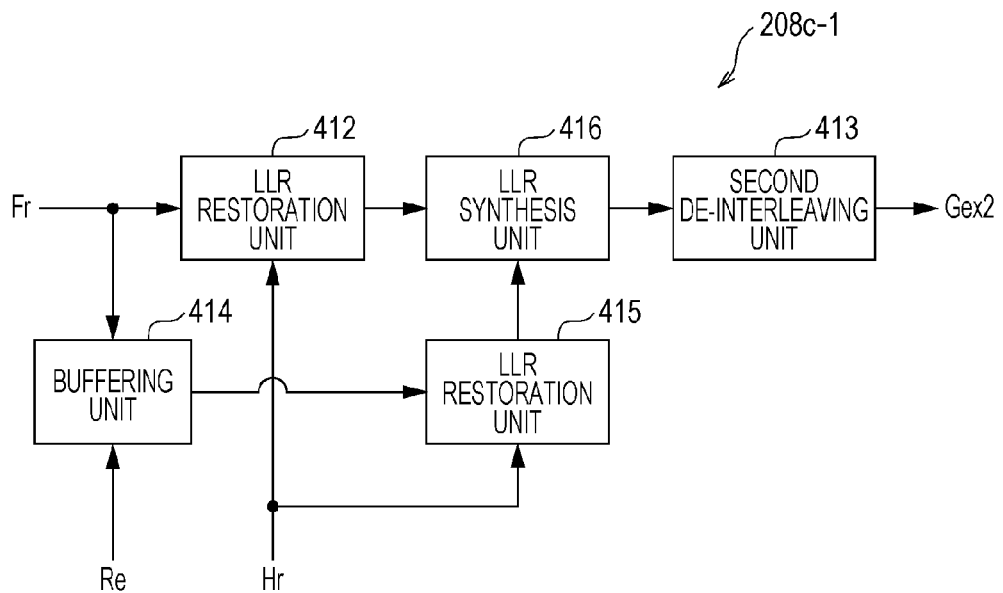
FIG. 24 is a schematic block diagram that illustrates a configuration example of an external LLR extraction unit 208c-1 in the same embodiment.

FIG. 24 is a schematic block diagram that illustrates a configuration example of the external LLR extraction unit 208c-1. The external LLR extraction unit 208c-1 is configured to include an LLR restoration unit 412, a second de-interleaving unit 413, a buffering unit 414, an LLR restoration unit 415, and an LLR synthesis unit 416. The LLR restoration unit 412 calculates an exclusive-OR operation of the LLR sequence Hr that the LLR discrimination unit 205 separates and the LLR sequence Fr that the LLR restoration information configuration unit 207 creates. The buffering unit 414 stores an LLR sequence Fr that the LLR discrimination unit 205 separates. When the retransmission control information Re is ACK, which indicates that it was possible to accurately detect a reception signal, the buffering unit 414 deletes the stored LLR sequence.

The LLR restoration unit 415 calculates an exclusive-OR operation of an LLR sequence of an initial transmission signal or a prior retransmission signal that the buffering unit 414 is storing and the LLR sequence Hr. Additionally, the LLR restoration unit 415 outputs zero when an initial transmission signal is received.

The LLR synthesis unit 416 synthesizes a calculation result of the LLR restoration unit 412 and a calculation result of the LLR restoration unit 415. In this instance, synthesis refers to the creation of a sequence that is formed from sums of LLRs by calculating sums of LLRs that configure LLR sequences of the calculation results. The second de-interleaving unit 413 performs realignment, which is the reverse of the realignment of the second interleaving unit 1026-2, on a synthesis result of the LLR synthesis unit 416 and inputs the result to the turbo decoding unit 206 as the LLR sequence Gex2.

Figure 25:
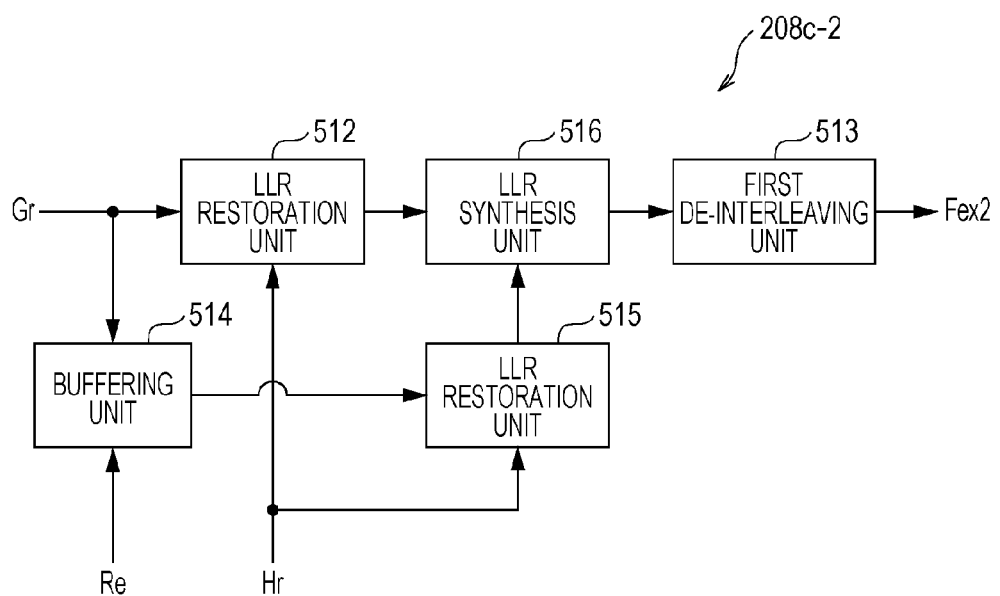
FIG. 25 is a schematic block diagram that illustrates a configuration example of an external LLR extraction unit 208c-2 in the same embodiment.

FIG. 25 is a schematic block diagram that illustrates a configuration example of the external LLR extraction unit 208c-2. The external LLR extraction unit 208c-2 is configured to include an LLR restoration unit 512, a first de-interleaving unit 513, a buffering unit 514, an LLR restoration unit 515, and an LLR synthesis unit 516. The LLR restoration unit 512 calculates an exclusive-OR operation of the LLR sequence Hr that the LLR discrimination unit 205 separates and the LLR sequence Gr that the LLR restoration information configuration unit 207 creates. The buffering unit 514 stores an LLR sequence Gr that the LLR discrimination unit 205 separates. When the retransmission control information Re is ACK, which indicates that it was possible to accurately detect a reception signal, the buffering unit 514 deletes the stored LLR sequence.

The LLR restoration unit 515 calculates an exclusive-OR operation of an LLR sequence of an initial transmission signal or a prior retransmission signal that the buffering unit 514 is storing and the LLR sequence Hr when a retransmission signal is received. Additionally, the LLR restoration unit 515 outputs zero when an initial transmission signal is received.

The LLR synthesis unit 516 synthesizes a calculation result of the LLR restoration unit 512 and a calculation result of the LLR restoration unit 515. In this instance, synthesis refers to the creation of a sequence that is formed from sums of LLRs by calculating sums of LLRs that configure LLR sequences of the calculation results. The first de-interleaving unit 513 performs realignment, which is the reverse of the realignment of the first interleaving unit 1026-1, and inputs the result to the turbo decoding unit 206 as the LLR sequence Fex2.

In the present embodiment, a case in which a ratio of parity bits on which information compression is carried out is higher in retransmission than in initial transmission, but a ratio of parity bits on which information compression is carried out may be lower in retransmission than in initial transmission. In addition, in the external LLR extraction unit 208c-1, LLR synthesis of the outputs of the LLR restoration units 412 and 415 is performed, but in a case in which the same information compression is carried out with at least a portion of bits in initial transmission and retransmission, LLR synthesis may be performed for a portion of bits only before input to the LLR restoration units 412 and 415.

In the abovementioned manner, by setting a ratio of parity bits on which information compression is carried out to be higher in retransmission than in initial transmission, it is possible to reduce a coding rate during retransmission signal reception due to the repetition of turbo coding and an LLR restoration process, and therefore, it is possible to improve coding gain. As a result of this, it is possible to improve error rate characteristics.

Fourth Embodiment

In the fourth embodiment, a case in which a transmission signal is sent by carrying out information compression on parity bits during multilevel modulation, will be explained. A wireless communication system 10d in the present embodiment is configured to include a transmission device 100d and a reception device 200d.

Figure 26:
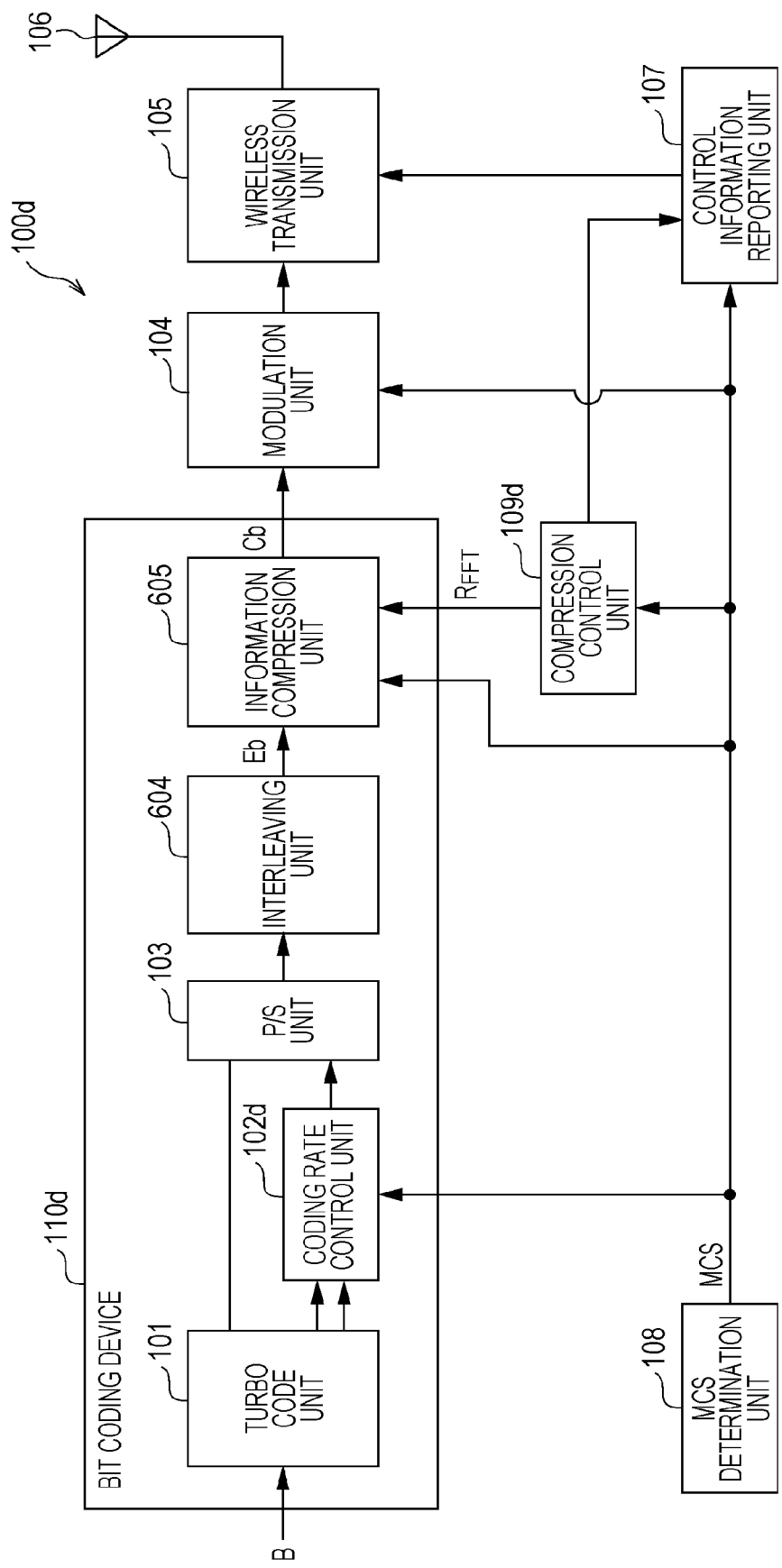
FIG. 26 is a schematic block diagram that illustrates a configuration example of a transmission device 100d according to a fourth embodiment of the invention.

FIG. 26 is a schematic block diagram that illustrates a configuration example of the transmission device 100d. In the same drawing, portions that correspond to each portion in FIG. 2 have been given the same symbols (101 and 103 to 108), and description thereof has been omitted. The transmission device 100d is configured to include a bit coding device 110d, a modulation unit 104, a wireless transmission unit 105, an antenna 106, a control information reporting unit 107, an MCS determination unit 108, and a compression control unit 109d. The bit coding device 110d is configured to include a turbo code unit 101, a coding rate control unit 102d, a P/S unit 103, an interleaving unit 604 and an information compression unit 605.

The coding rate control unit 102d performs puncturing of bits on parity bits on that the turbo code unit 101 creates using a puncturing pattern that corresponds to a coding rate that is designated from the MCS determination unit 108. The coding rate control unit 102d inputs parity bit sequences after bit puncturing to the P/S unit 103.

The interleaving unit 604 realigns a coded bit sequence that is input from the P/S unit 103, sets the coded bit sequence to a predetermined index of a coded bit sequence so that bits on which information compression is carried out are not inclined, and inputs to the information compression unit 605.

The information compression unit 605 performs information compression of a portion of bits of a coded bit sequence Eb that the interleaving unit 604 realigned. Furthermore, the information compression unit 605 duplicates a bit number of bits of an information compression result that is reduced by information compression. The information compression unit 605 creates a bit sequence Cb that is formed from bits on which information compression was not performed, and duplicated bits. Additionally, the coded bit sequence Eb and the bit sequence Cb have the same bit number. In addition, the information compression unit 605 determines bits on which information compression is carried out according to a ratio $R_{FFT}$ that the compression control unit 109d determines. In this instance, the ratio $R_{FFT}$ is a ratio of symbols among symbols that are transmitted, which include bits on which information compression was performed. The details of the information compression unit 605 will be described later.

The compression control unit 109d determines the ratio $R_{FFT}$ of symbols among symbols that are transmitted, which include bits on which information compression was carried out. As a method with which the compression control unit 109d determines the ratio $R_{FFT}$, in the same manner as the compression control unit 109 in FIG. 2, there is a method that performs determination using EXtrinsic Information Transfer (EXIT) analysis, a method that performs determination using a coding rate, a method that performs determination depending on propagation route characteristics, a method that performs determination depending on a modulation method that is used in transmission, a method that performs determination depending on whether or not MIMO transmission is used or the like. In methods that perform determination depending on a coding rate or a modulation method, for example, the ratio $R_{FFT}$ increases with increases in either or both the coding rate and a modulation multi-value. The compression control unit 109d inputs the determined ratio $R_{FFT}$ to the information compression unit 605. In addition, the compression control unit 109d inputs the determined ratio $R_{FFT}$ to the information reporting unit 107 in order to transmit the ratio $R_{FFT}$ to the reception device 200d.

Figure 27:
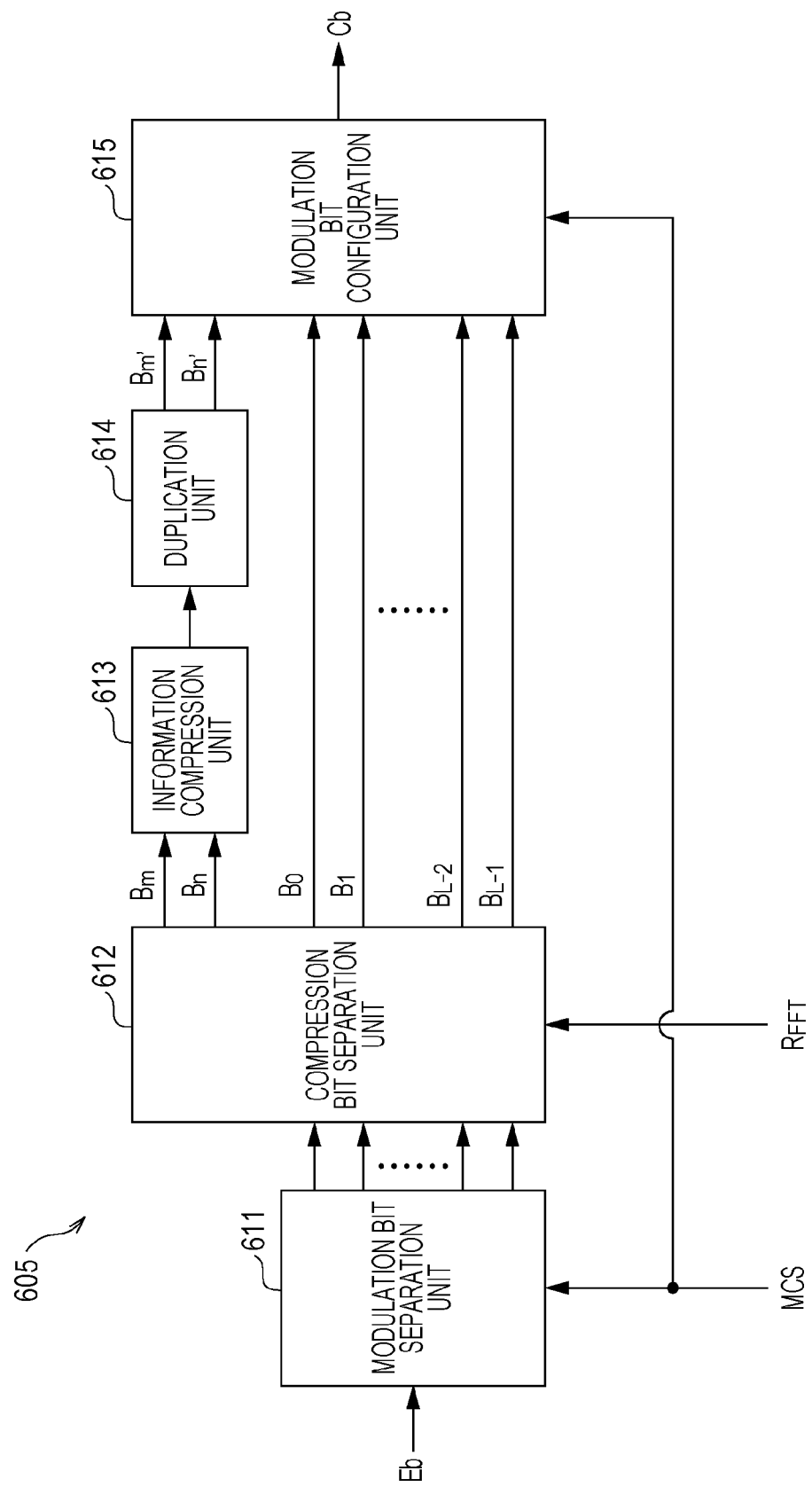
FIG. 27 is a schematic block diagram that illustrates a configuration example of an information compression unit 605 in the same embodiment.

FIG. 27 is a schematic block diagram that illustrates a configuration example of an information compression unit 605. The information compression unit 605 is configured to include a modulation bit separation unit 611, a compression bit separation unit 612, an information compression unit 613, a duplication unit 614, and a modulation bit configuration unit 615. The modulation bit separation unit 611 separates bits that configure the coded bit sequence Eb into each coded bit group in order to create one modulation symbol of a modulation method of a combined MCS that is designated from the MCS determination unit 108. If a number of coded bits that configures the coded bit group is set as a bit number L, the $L^{th}$ power of 2 is equivalent to a modulation multi-value of the modulation method. For example, if the modulation method is 16-QAM, L=4, and if the modulation method is 64-QAM, L=6.

The compression bit separation unit 612 determines whether or not each coded bit group that the modulation bit separation unit 611 separates is a target of information compression. Additionally, the compression bit separation unit 612 performs the abovementioned determination using a rule that is determined in advance so that a ratio of coded bit groups among the coded bit groups that are targets of information compression becomes the ratio $R_{FFT}$ that is designated by the compression control unit 209d. Additionally, the rule that is determined in advance may be any rule as long as the same result is obtained in the reception device 200d.

With respect to coded bit groups that are determined to not be targets of information compression, the compression bit separation unit 612 inputs bits $B_1$ to $B_{L-1}$, which configure corresponding coded bit groups to the modulation bit configuration unit 615 without change. With respect to coded bit groups that are determined to be targets of information compression, the compression bit separation unit 612 inputs bits $B_m$ and $B_n$ of the bits $B_0$ to $B_{L-1}$ that configure corresponding coded bit groups to the information compression unit 613 and inputs the remaining bits to the modulation bit configuration unit 615.

The information compression unit 613 calculates an exclusive-OR operation of the bits $B_m$ and $B_n$ that are input from the compression bit separation unit 612. The duplication unit 614 duplicates a calculation result of the information compression unit 613, and inputs the result to the modulation bit configuration unit 615 as bits $B_m'$ and $B_n'$. When the bits $B_m'$ and $B_n'$ are input from the duplication unit 614, among the bits $B_0$ to $B_{L-1}$ that are input from the compression bit separation unit 612, the modulation bit configuration unit 615 sets the bits $B_m$ and $B_n$ as the bit sequence Cb in place of the bits $B_m'$ and $B_n'$. In addition, when the bits $B_m'$ and $B_n'$ are not input from the duplication unit 614, the modulation bit configuration unit 615 sets the bits $B_0$ to $B_{L-1}$ that are input from the compression bit separation unit 612 as the bit sequence Cb without change.

Since the modulation bit configuration unit 615 determines an alignment order of coded bit sequences in this manner, among modulation symbols that the modulation unit 104 creates using the coded bit sequences, the ratio $R_{FFT}$ becomes a modulation symbol that depends on a bit group that includes bits on which information compression is carried out, that is, the same two bits that were duplicated (a duplication source bit and a duplicated bit).

Figure 28:
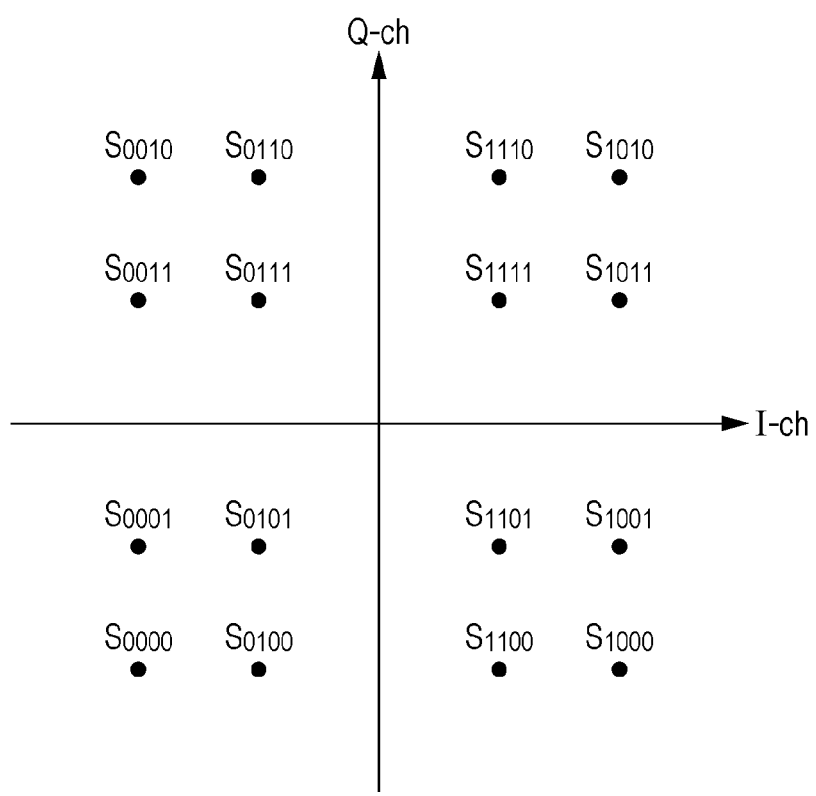
FIG. 28 is a diagram that illustrates an example of signal point arrangement when a modulation method is 16-QAM.

FIG. 28 is a diagram that illustrates an example of signal point arrangement when a modulation method is 16-QAM. In FIG. 28, the horizontal axis is an actual axis, and the vertical axis is a virtual axis. Signal points (modulation symbols) $S_{0000}$ to $S_{1111}$ are respectively symbols that correspond to bit sequences "0000" to "1111".

That is, at each signal point, a suffix is equivalent to a bit sequence that corresponds to the signal. In this example, a quadrant that is disposed at a $1^{st}$ bit and a $3^{rd}$ bit is determined, and signal points that are within the quadrant at a $2^{nd}$ bit and a $4^{th}$ bit are determined. Therefore, a distance between signal points of the $1^{st}$ bit and the $3^{rd}$ bit is long and it is unlikely that errors will occur, and therefore, it is likely that errors will occur at the $2^{nd}$ and $4^{th}$ bit.

In such an instance, when the modulation method is 16-QAM, the compression bit separation unit 612 sets 1 bit (for example, a highest bit) of either the $1^{st}$ bit or the $3^{rd}$ bit as the bit $B_m$, and sets 1 bit (for example, a lowest bit) of either the $2^{nd}$ bit or the $4^{th}$ bit as the bit $B_n$. That is, the compression bit separation unit 612 sets either one of bits for determining a quadrant of a signal, and either one of bits for determining a disposition within the quadrant as the bits $B_m$ and $B_n$. When the modulation method is a method other than 16-QAM, in the same manner, a bit in which a distance between signal points is long and it is unlikely that errors will occur, and a bit other than such a bit are set as the bits $B_m$ and $B_n$.

A specific example will be explained below. A $k^{th}$ modulation symbol of 16-QAM is a target of information compression, and a bit sequence for creating the corresponding modulation symbol is set as $b_1$ (k), $b_2$ (k), $b_3$ (k), and $b_4$ (k). $b_1$ (k) and $b_3$ (k) correspond to the $1^{st}$ bit and the $3^{rd}$ bit, and $b_2$ (k) and $b_4$ (k) correspond to the $2^{nd}$ and $4^{th}$ bits.

The compression bit separation unit 612 of this case sets $b_1$ (k) as the bit $B_m$, and sets $b_2$ (k) as the bit $B_n$. The information compression unit 613 calculates an exclusive-OR operation of $b_1$ (k) and $b_2$ (k), and obtains a bit $b_{XOR}$ (k) as a calculation result thereof. The duplication unit 614 duplicates the bit $b_{XOR}$ (k). The modulation bit configuration unit 615 inputs the bit $b_{XOR}$ (k), $b_{XOR}$ (k), $b_3$ (k) and $b_4$ (k) to the modulation unit 104 as the bit sequence Cb. Therefore, the modulation unit 104 creates a modulation symbol that corresponds to the bit $b_{XOR}$ (k), $b_{XOR}$ (k), $b_3$ (k) and $b_4$ (k).

Figure 29:
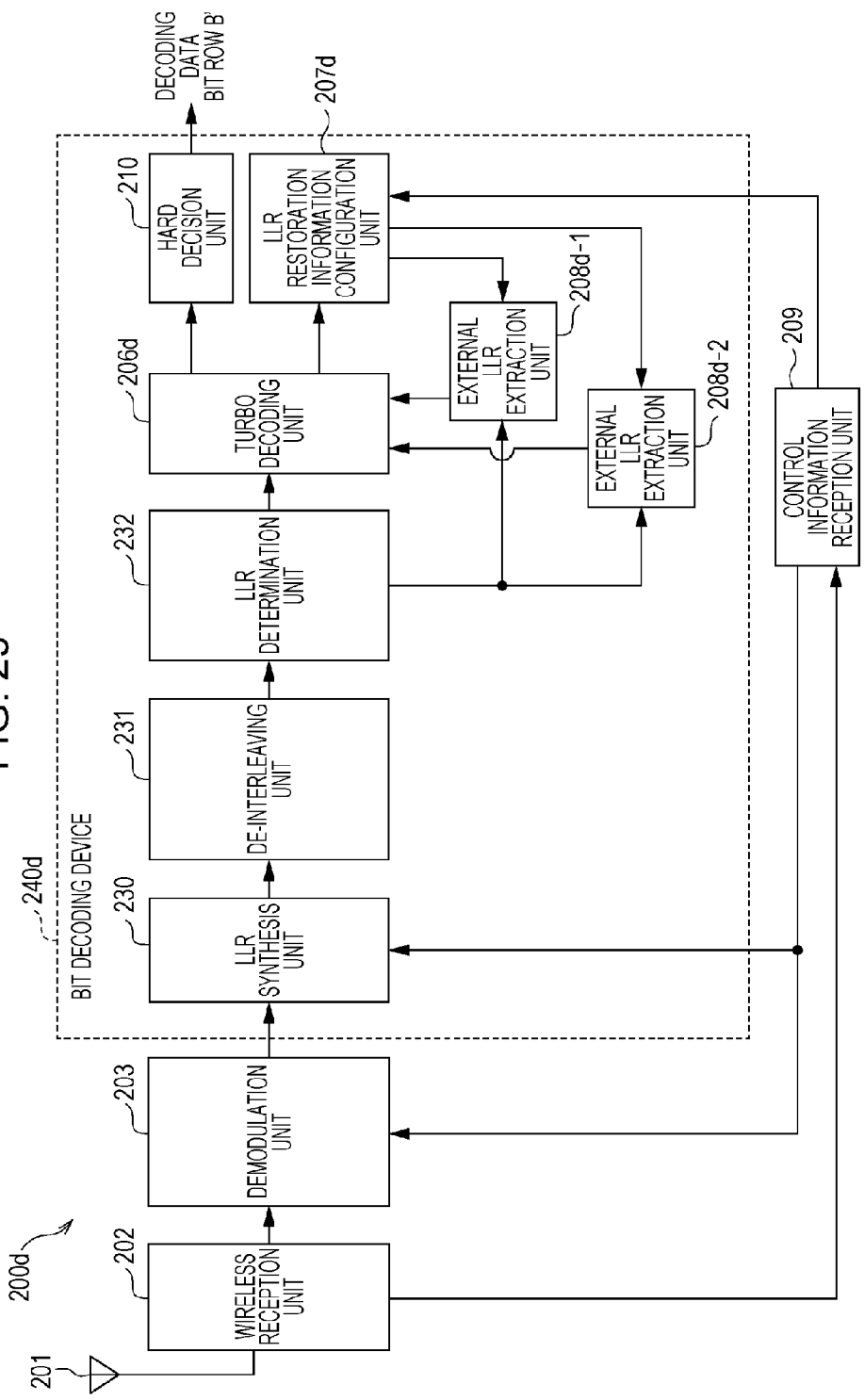
FIG. 29 is a schematic block diagram that illustrates a configuration example of a reception device 200d in the same embodiment.

FIG. 29 is a schematic block diagram that illustrates a configuration example of the reception device 200d. In the same drawing, portions that correspond to each portion in FIG. 2 have been given the same symbols, and description thereof has been omitted. As illustrated in FIG. 29, the reception device 200d is configured to include an antenna 201, a wireless reception unit 202, a demodulation unit 203, a bit decoding device 240d, and a control information reception unit 209. The bit decoding device 240d is configured to include an LLR synthesis unit 230, a de-interleaving unit 231, an LLR discrimination unit 232, a turbo decoding unit 206d, an LLR restoration information configuration unit 207d, external LLR extraction units 208d-1 and 208d-2, and a hard decision unit 210.

The LLR synthesis unit 230 synthesizes LLRs of duplicated bits, and among LLR sequences that the demodulation unit 203 creates, creates an LLR sequence in which LLRs of duplicated bits have been replaced with synthesized LLRs. More specifically, among LLRs that the demodulation unit 203 creates, the LLR synthesis unit 230 decides upon LLRs of duplicated bits, on which information compression has been performed in the transmission device 100d by referring to the ratio $R_{FFT}$ that the control information reception unit 209 receives. The LLR synthesis unit 230 synthesizes LLRs of duplicated bits. In this instance, synthesis refers to adding LLRs.

Among the LLR sequences that the LLR synthesis unit 230 creates, the LLR synthesis unit 230 replaces LLRs of duplicated bits (the bits $B_m'$ and $B_n'$) with synthesized LLRs. Additionally, with respect to two LLRs of duplicated bits, there is a single synthesized LLR. In such an instance, the LLR synthesis unit 230 may replace both of the two LLRs of duplicated bits with the synthesized LLRs, or may replace only one of the two duplicated bits with a synthesized LLR, and replace the other with dummy data. The de-interleaving unit 231 performs realignment, which is the reverse of the realignment of the interleaving unit 604 in FIG. 28 on an LLR sequence that the LLR synthesis unit 230 creates.

The LLR discrimination unit 232 separates LLRs that were synthesized by the LLR synthesis unit 230 from an LLR sequence that the de-interleaving unit 231 realigned, and inputs the LLRs to the external LLR extraction units 208d-1 and 208d-2. Additionally, in the abovementioned manner, when both of the two LLRs of duplicated bits are replaced with synthesized LLRs, among the two synthesized LLRs with which replacement is performed, only one is separated. In addition, among an LLR sequence that the de-interleaving unit 231 realigns, the LLR discrimination unit 232 inputs LLRs of bits on which information compression was not performed to the turbo decoding unit 206d.

The turbo decoding unit 206d performs turbo decoding of an LLR sequence that is input from the LLR discrimination unit 232 and LLR sequences that are input from the external LLR extraction units 208d-1 and 208d-2. Additionally, the turbo decoding unit 206d inputs LLRs of coded bits of a turbo decoded result to the LLR restoration information configuration unit 207d. As a result of this, a repeated process is performed by the turbo decoding unit 206d and the external LLR extraction units 208d-1 and 208d-2. On an initial run of the repeated process, the turbo decoding unit 206d inserts "0" at positions that correspond to duplicated bits for an LLR sequence that is input from the LLR discrimination unit 232, and performs turbo decoding of an LLR sequence in which insertion has been performed. Further, on a second time of the repeated process and thereafter, the turbo decoding unit 206d inserts LLRs that the external LLR extraction units 208d-1 and 208d-2 create at positions that correspond to duplicated bits for an LLR sequence that is input from the LLR discrimination unit 232, and performs turbo decoding of an LLR sequence in which insertion has been performed. In addition, when the repeated process has been repeated a predetermined number of times, among turbo decoding results, the turbo decoding unit 206d inputs LLRs of systematic bits to the hard decision unit 210.

The LLR restoration information configuration unit 207d extracts LLRs of bits on which information compression was performed (the bits $B_m$ and $B_n$) from coded bit LLRs of turbo decoding results of the turbo decoding unit 206d.

Among the extracted LLRs, the LLR restoration information configuration unit 207d inputs LLRs of bit $B_m$ to the external LLR extraction unit 208d-1, and inputs LLRs of bit $B_n$ to the external LLR extraction unit 208d-2.

The external LLR extraction unit 208d-1 calculates an exclusive-OR operation of LLRs that are input from the LLR discrimination unit 232 and LLRs of the bit $B_m$, that is input from the LLR restoration information configuration unit 207d, and inputs LLRs of a calculation result to the turbo decoding unit 206d. Since LLRs that are input from the LLR discrimination unit 232 are LLRs that correspond to the duplicated bits $B_m'$ and $B_n'$, the calculation results thereof become LLRs that correspond to the bit $B_n$.

The external LLR extraction unit 208d-2 calculates an exclusive-OR operation of LLRs that are input from the LLR discrimination unit 232 and LLRs of the bit $B_n$ that is input from the LLR restoration information configuration unit 207d, and inputs LLRs of a calculation result to the turbo decoding unit 206d. Since LLRs that are input from the LLR discrimination unit 232 are LLRs that correspond to the duplicated bits $B_m'$ and $B_n'$, the calculation results thereof become LLRs that correspond to the bit $B_m$.

In the present embodiment, an example in which information compression of 1 bit of either the $1^{st}$ bit or the $3^{rd}$ bit, the distance between signal points of which are long, and 1 bit of either the $2^{nd}$ bit or the $4^{th}$ bit, the distance between signal points of which are short, is performed, is explained. Since this kind of combination is used, bits in which it is unlikely that errors will occur since the distance between signal points is long are included in both bits on which information compression is performed and bits on which information compression is not performed.

That is, LLRs of bits in which it is unlikely that errors will occur are used in the decoding in the repeated process. Therefore, in the decoding, an improvement in likelihood is anticipated, and therefore, it is possible to perform the repeated process efficiently and the bit combination is preferable. However, the bit combination is not limited to this configuration. For example, information compression of the $1^{st}$ bit and the $3^{rd}$ bit may be performed, and information compression of the $2^{nd}$ bit and the $4^{th}$ bit may be performed. In addition, even if these combinations are used, the reception process is the same as the reception process in the present embodiment.

In the abovementioned manner, in the present embodiment, when multi-value modulation is used, information compression of bits in which the occurrence of errors is likely, and bits in which the occurrence of errors in unlikely, is performed, and turbo decoding and the calculation of an exclusive-OR operation of LLRs are repeated. As a result of this, since it is possible to improve the precision of turbo decoding, it is possible to improve a coding gain. As a result of this, it is possible to improve error rate characteristics.

Additionally, in each of the abovementioned embodiments, a case in which turbo code and turbo decoding are respectively used as a coding method and a decoding method has been described, but as long as a coding method and a decoding method capable of calculating LLRs of bits that are a target of information compression during decoding, the methods are not limited to turbo code and turbo decoding. For example, a configuration in which convolutional code or Low Density Parity Check (LDPC) code is used as the coding method, may also be used.

In addition, in each of the abovementioned embodiments, information compression is performed after puncturing when coded bit sequences are created, but a configuration in which puncturing is performed after information compression has been performed, may also be used.

In addition, in each of the abovementioned embodiments, a case in which a bit coding device and a bit decoding device are used by a transmission device and a reception device of a wireless communication system was described. However, a configuration in which a bit coding device and a bit decoding device may be used by a transmission device and a reception device of other communication systems that use wired communication or the like, or may be used in a system other than a communication system such as a writing device that records data on a recording medium and a reading device that reads data from a recording medium, may also be used.

In addition, in each of the abovementioned embodiments, a configuration in which the devices are realized by recording programs for implementing a portion of the functions or all of the functions of each of the transmission device, the reception device, the bit coding device and the bit decoding device on a computer-readable recording medium, and executing the programs that are recorded on the recording medium by causing a computer system to read the programs, may be used. Additionally, in this instance, a "computer system" refers to a system that includes an OS and hardware such as peripheral equipment.

In addition, "a computer-readable recording medium" refers to a portable medium such as a flexible disc, an optical disc, a ROM, a CD-ROM or the like, or a storage device such as a hard disk that is installed inside a computer system. Furthermore, "a computer-readable recording medium" refers to a medium that also includes media that dynamically maintains a program for a short period of time in the manner of a communication line of a case in which a program is transmitted via a network such as the Internet or the communication line such as a telephone line, and media that temporarily maintains a program in the manner of volatile memory inside a computer system that is a server or a client in the abovementioned case. In addition, the abovementioned program may be a program for realizing the abovementioned portion of functions, and furthermore, may be a program capable of realizing the abovementioned functions in combination with programs that are already recorded on a computer system.

In addition, in each of the abovementioned embodiments, a portion of or all of the functions of each of the transmission device, the reception device, the bit coding device and the bit decoding device may be realized as an LSI, which is typically an integrated circuit. Each functional block of the transmission device, the reception device, the bit coding device and the bit decoding device may be converted into chips individually, or a portion of or all functional blocks may be converted into chips in an integrated manner. In addition, a technique of realizing an integrated circuit is not limited to LSI, and may be realized by a dedicated circuit, or a general purpose processor.

In addition, in a case in which a technology of conversion into an integrated chip that replaces LSI is developed due to the progress of semiconductor technology, it is possible to use an integrated chip according to the corresponding technology.

Embodiments of the invention have been described in detail with reference to the drawings, but specific configurations are not limited to the embodiments, and include design changes of an extent that does not depart from the scope of the invention.

DESCRIPTION OF REFERENCE NUMERALS

10 WIRELESS COMMUNICATION SYSTEM
100, 100c, 100d TRANSMISSION DEVICE
101 DATA CODE UNIT
102, 102b, 102d CODING RATE CONTROL UNIT
103 P/S UNIT
104 MODULATION UNIT
105 WIRELESS TRANSMISSION UNIT
106 ANTENNA
107 CONTROL INFORMATION REPORTING UNIT
108 MCS DETERMINATION UNIT
109, 109c, 109d COMPRESSION CONTROL UNIT
110, 110d BIT CODING DEVICE
111c RETRANSMISSION CONTROL UNIT
200, 200a, 200b, 200c, 200d RECEPTION DEVICE
201 ANTENNA
202 WIRELESS RECEPTION UNIT
203 DEMODULATION UNIT
204 S/P UNIT
205 LLR DISCRIMINATION UNIT
206, 306, 206b, 206d TURBO DECODING UNIT
207, 207b, 207d LLR RESTORATION INFORMATION CONFIGURATION UNIT
208-1, 208-2, 208b-1, 208b-2, 208b-3, 208c-1, 208c-2, 208d-1, 208d-2 EXTERNAL LLR EXTRACTION UNIT
209 CONTROL INFORMATION RECEPTION UNIT
210 HARD DECISION UNIT
219 BUFFERING UNIT
220 LLR SYNTHESIS UNIT
221 CRC UNIT
222 BUFFERING UNIT
223 LLR SYNTHESIS UNIT
230 LLR SYNTHESIS UNIT
231 DE-INTERLEAVING UNIT
232 LLR DISCRIMINATION UNIT
240, 240a, 240b, 240c, 240d BIT DECODING DEVICE
402, 412, 415, 502, 512, 515, 704, 804, 904 LLR RESTORATION UNIT
403, 413, 905 SECOND DE-INTERLEAVING UNIT
414, 514 BUFFERING UNIT
416, 516 LLR SYNTHESIS UNIT
503, 513, 805 FIRST DE-INTERLEAVING UNIT
604 INTERLEAVING UNIT
605 INFORMATION COMPRESSION UNIT
611 MODULATION BIT SEPARATION UNIT
612 COMPRESSION BIT SEPARATION UNIT
613 INFORMATION COMPRESSION UNIT
614 DUPLICATION UNIT
615 MODULATION BIT CONFIGURATION UNIT
705 THIRD DE-INTERLEAVING UNIT
1011 FIRST RECURSIVE CONVOLUTIONAL CODE UNIT
1012 INTERNAL INTERLEAVING UNIT
1013 SECOND RECURSIVE CONVOLUTIONAL CODE UNIT
1020 PUNCTURING PATTERN STORAGE UNIT
1021 PUNCTURING UNIT
1022 P/S UNIT 1023, 1024, 1023b, 1024b BIT DISCRIMINATION UNIT
1025 COMPRESSED BIT NUMBER CALCULATION UNIT
1026-1 FIRST INTERLEAVING UNIT
1026-2 SECOND INTERLEAVING UNIT
1026-3 THIRD INTERLEAVING UNIT
1027, 1027b INFORMATION COMPRESSION UNIT
1028 P/S UNIT
2021 PUNCTURING UNIT
2022 P/S UNIT
2023 BIT DISCRIMINATION UNIT
2024 BIT DISCRIMINATION UNIT
2026-1 FIRST INTERLEAVING UNIT
2026-2 SECOND INTERLEAVING UNIT
2060, 2060b PARITY BIT DISCRIMINATION UNIT
2061 S/P UNIT
2062, 2062a FIRST MAP DECODING UNIT
2063, 2064 INTERNAL INTERLEAVING UNIT
2065, 2065a SECOND MAP DECODING UNIT
2066 INTERNAL DE-INTERLEAVING UNIT
2067, 2068 P/S UNIT

The invention claimed is:

1. A transmission device comprising:
a bit coding device configured to create a coded bit sequence by performing error correction coding on an input bit sequence, the bit coding device comprising:
a coding circuit configured to create a first bit sequence by performing the error correction coding on the input bit sequence;
an extraction circuit configured to extract a second bit sequence from the first bit sequence; and
an information compression circuit configured to create a third bit sequence by performing lossy compression on the second bit sequence,
wherein coded bits of the coded bit sequence include at least a portion of the third bit sequence;
a modulation circuit configured to create a modulation symbol sequence that corresponds to the coded bit sequence;
a transmission circuit configured to transmit a signal based on the modulation symbol sequence; and
a compression control circuit configured to determine a ratio of a bit number of the third bit sequence that the bit coding device includes in the coded bit sequence, with respect to a bit number of the input bit sequence, depending on a coding rate used by the bit coding device or a modulation method used by the modulation circuit.

2. The transmission device according to claim 1, wherein the compression control circuit is configured to determine the ratio depending on a number of times of retransmission of the input bit sequence.

3. The transmission device according to claim 1, wherein the compression control circuit is configured to determine the ratio using EXIT analysis.

4. A reception device comprising:
a reception circuit configured to receive a first signal transmitted based on a coded bit sequence by a transmission device, the coded bit sequence being created by the transmission device creating a first bit sequence by performing an error correction coding on an input bit sequence input to the transmission device, extracting a second bit sequence from the first bit sequence, and creating a third bit sequence by performing lossy compression on the second bit sequence, wherein coded bits of the coded bit sequence include at least a portion of the third bit sequence;
a demodulation circuit configured to demodulate the first signal received;
a bit decoding device comprising:
a discrimination circuit configured to extract the third bit sequence from the first signal demodulated;
a decoding device configured to decode a decoding process on the first signal demodulated;
an external information extraction circuit configured to create a second signal that corresponds to at least a portion of the second bit sequence using the third bit sequence extracted and results of the decoding process;
wherein the decoding device is configured to perform at least once the decoding process using the second signal created, and
wherein a ratio of a bit number of the third bit sequence that the transmission device includes in the coded bit sequence, with respect to a bit number of the input bit sequence, is determined by the transmission device depending on a coding rate or a modulation method used by the transmission device.

5. The reception device according to claim 4, further comprising:
a compression control circuit configured to
decide the ratio depending on the coding rate used by the transmission device or the demodulation method used by the demodulation circuit, and
report the ratio to the discrimination circuit,
wherein the discrimination circuit is configured to extract the third bit sequence using the ratio.

6. The reception device according to claim 4, further comprising:
a compression control circuit configured to
decide the ratio depending on a number of times the first signal has been retransmitted by the transmission device, and
report the ratio to the discrimination circuit,
wherein the discrimination circuit is configured to extract the third bit sequence using the ratio.

7. The reception device according to claim 4, further comprising:
a compression control circuit configured to
decide the ratio using EXIT analysis, and
report the ratio to the discrimination circuit,
wherein the discrimination circuit is configured to extract the third bit sequence using the ratio.

8. The reception device according to claim 4,
wherein the external information extraction circuit is configured to create at least a portion of the second bit sequence by calculating an exclusive-OR operation of the third bit sequence extracted and a portion of the second bit sequence included in results of the decoding process.

9. A bit decoding device to be included in a reception device configured to communicate with a transmission device, the bit decoding device comprising:
a synthesis circuit configured to synthesize first bits included in coded bits and second bits duplicated from the first bits, the coded bits being of a coded bit sequence created by the transmission device creating a first bit sequence by performing an error correction coding on an input bit sequence input to the transmission device, extracting a second bit sequence from the first bit sequence, and creating a third bit sequence by performing lossy compression on the second bit sequence, wherein the coded bits of the coded bit sequence include at least a portion of the third bit sequence;

a decoding circuit configured to perform a decoding process on a first signal received by the reception device from the transmission device; and an external information extraction circuit configured to create a second signal that corresponds to at least a portion of the second bit sequence using the synthesized bits and results of the decoding process, wherein the decoding circuit is configured to perform at least once the decoding process using the second signal created by the external information extraction circuit, and wherein a ratio of a bit number of the third bit sequence that the transmission device includes in the coded bit sequence, with respect to a bit number of the input bit sequence, is determined by the transmission device depending on a coding rate or a modulation method used by the transmission device.

10. The bit coding device according to claim 9,
wherein the information compression circuit is configured to create the third bit sequence using an exclusive-OR operation of bits that constitute the second bit sequence.

11. The bit coding device according to claim 10,
wherein the exclusive-OR operation is an exclusive-OR operation with three or more bits.

12. The bit coding device according to claim 10, further comprising:

a duplication circuit configured to duplicate bits among the third bit sequence that are included in the coded bit sequence; and a modulation bit configuration circuit configured to determine an alignment order of the coded bit sequence so that at least a portion of modulation symbols corresponds to a bit group that includes bits of a duplication source of duplication by the duplication circuit and duplicated bits when the modulation symbols are created using the coded bit sequence.

* * * * *